United States Patent [19]
Sato

[11] Patent Number: 6,159,655
[45] Date of Patent: Dec. 12, 2000

[54] POSITIVE PHOTORESIST COMPOSITION FOR EXPOSURE TO FAR ULTRAVIOLET LIGHT

[75] Inventor: Kenichiro Sato, Shizuoka, Japan

[73] Assignee: Fuji Photo Film Co., Ltd., Kanagawa, Japan

[21] Appl. No.: 09/264,036

[22] Filed: Mar. 8, 1999

[30] Foreign Application Priority Data

Mar. 20, 1998 [JP] Japan ................................. 10-072478
May 19, 1998 [JP] Japan ................................. 10-136918

[51] Int. Cl.$^7$ ................................. G03C 1/73; G03C 1/72
[52] U.S. Cl. ...................... 430/270.1; 430/906; 430/910; 430/905; 430/914
[58] Field of Search .................. 430/270.1, 914, 430/908, 906, 905, 910

[56] References Cited

U.S. PATENT DOCUMENTS 6,013,416  1/2000  Nozaki et al. ................... 430/283.1

FOREIGN PATENT DOCUMENTS 0 789 278 A2  8/1997  European Pat. Off. .
0 878 738 A2  11/1998  European Pat. Off. .

*Primary Examiner*—Janet Baxter
*Assistant Examiner*—Sin J. Lee
*Attorney, Agent, or Firm*—Sughrue, Mion, Zinn, Macpeak & Seas, PLLC

[57] ABSTRACT

A positive photoresist composition position for exposure to far ultraviolet light, which comprises a resin decomposing by the action of an acid to increase its solubility in an alkali, and a compound generating an acid by irradiation with an actinic ray or radiation; with the resin comprising repeating units having particular structures, including particular alicyclic structures, and groups decomposing by the action of an acid.

1 Claim, No Drawings

POSITIVE PHOTORESIST COMPOSITION FOR EXPOSURE TO FAR ULTRAVIOLET LIGHT

FIELD OF THE INVENTION

The present invention relates to a positive photoresist composition used in an ultramicrolithographic process, e.g., for the production of VLSI and high capacity chips, or other photofabrication processes. In particular, the invention relates to a positive photoresist composition capable of forming highly precise patterns by using light in the far ultraviolet region, including excimer laser beams.

BACKGROUND OF THE INVENTION

The degree of integration of integrated circuits is becoming much higher, and the photolithography for superfine patterns having a line width of half micron or below is beginning to be required in the production of semiconductor substrates for VLSI and the like. In order to meet such a requirement, the wavelengths used in an exposure apparatus for photolithography are becoming shorter, and nowadays the use of far ultraviolet light in shorter wavelength region, or excimer laser beams (XeCl, KrF, ArF), is being investigated.

The novolak-naphthoquinone diazide resist is inadequate to be used in the pattern formation by the photolithography in the far ultraviolet region. This is because both novolak resin and naphthoquinone diazide compound have strong absorption in such a wavelength region to inhibit the light from reaching to the bottom of the resist; as a result, the resist has low sensitivity and can merely provide a tapered pattern profile.

For instance, the chemical amplification resist compositions disclosed in U.S. Pat. No. 4,491,628 and European Patent 0,249,139 are one means for solving the above-described problem. The chemical amplification-utilized positive resist composition is a composition designed such that it generates an acid in the exposed part upon irradiation with an actinic ray, such as far ultraviolet light, and causes a reaction using the acid as catalyst to make a difference of solubility in a developer between the irradiated part and the non-irradiated part. By virtue of this solubility difference, a pattern can be formed on a substrate coated with such a composition.

In general, the chemical amplification resist is roughly divided into three types, the so-called two-component, two point five-component and three-component types. The chemical amplification resist of two-component type is a combination of a compound capable of generating an acid by photolysis (herein after referred to as a "photoacid generator") with a binder resin. The binder resin combined with such a compound has, in a molecule, groups capable of being decomposed by the action of an acid to increase the solubility of resin in an alkali developer (which are hereinafter referred to as "acid-decomposable groups"). The resist of two point five-component type further contains a low molecular weight compound having an acid-decomposable group in addition to the above two components. The resist of three-component type contains a photoacid generator, an alkali-soluble resin and the above low molecular weight compound.

Examples of a combination of an photoacid generator with a resin capable of changing its solubility by the action of an acid, which is used for the resist of two- or two point five-component type, include the combination of a photoacid generator with acetal or an O, N-acetal compound (JP-A-48-89003, wherein the term "JP-A" means an unexamined published Japanese patent application"), the combination of a photoacid generator with an orthoester or amidoacetal compound (JP-A-51-120714), the combination of a photoacid generator with a polymer having acetal or ketal groups in its main chain (JP-A-53-133429), the combination of a photoacid generator with an enol ether compound (JP-A-55-12995), the combination of a photoacid generator with an N-acyliminocarbonic acid compound (JP-A-55-126236), the combination of a photoacid generator with a polymer having orthoester groups in its main chain (JP-A-56-17345), the combination of a photoacid generator with a tertiary alkyl ester compound (JP-A-60-3625), the combination of a photoacid generator with a silyl ester compound (JP-A-60-10247), the combinations of a photoacid generator with tertiary or secondary carbon-containing (e.g., t-butyl, 2-cyclohexenyl) esters or carbonate compounds (e.g., JP-A-63-250642, *Polym. Eng. Sci.*, vol. 23, p. 1012 (1983); *ACS. Sym.*, vol. 242, p. 11 (1984); *Semiconductor World*, the November number, p. 91 (1987); *Macromolecules*, vol. 21, p. 1475 (1988); and *SPIE*, vol. 920, p. 42 (1988)), and the combinations of a photoacid generator with silyl ether compounds (JP-A-60-37549 and JP-A-60-121446) Those combinations have a quantum yield greater than 1 in principle, so that they exhibit high sensitivity.

As described above, the chemical amplification resist is a photoresist suitable for exposure to ultraviolet light or far ultraviolet light. Further, it is necessary for the resist to meet the requirements for characteristics from the viewpoint of practical use. In the case of using a KrF excimer laser beam of 248 nm as exposure light, for instance, the resist compositions comprising a hydroxystyrene polymer, which shows only slight absorption of the laser beam, into which acetal or ketal groups are introduced as protective groups, have been proposed in, e.g., JP-A-2-141636, JP-A-2-19847, JP-A-4-219757 and JP-A-5-281745. In addition, the compositions which are similar to the above, except that t-butoxycarbonyloxy or p-tetrahydropyranyloxy groups are introduced thereinto as acid-decomposable groups, have been proposed in, e.g., JP-A-2-209977, JP-A-3-206458 and JP-A-2-19847. Although those compositions are suitable for the case of using the KrF excimer laser beam of 248 nm, they have low sensitivity to an ArF excimer laser beam because their absorbance at the wavelength of ArF excimer laser beam is substantially too high. This drawback is accompanied with other drawbacks of causing deterioration in, e.g., definition, focus latitude and pattern profile. Therefore, it is necessary for those compositions to be improved in many points.

As photoresist compositions suitable for the ArF excimer light source, the combinations of (meth) acrylic resins showing less absorption of light than partially hydroxylated styrene resins with compounds capable of generating acids upon exposure are proposed in, e.g., JP-A-7-199467 and JP-A-7-252324. Specifically, JP-A-6-289615 discloses the acrylic resin having carboxyl groups the oxygen atoms of which are bonded to tertiary carbon-containing organic groups to form ester linkages.

Further, JP-A-7-234511 discloses the acid-decomposable resin containing both acrylate and fumarate as constitutional repeating units. However, those resins cannot provide satisfactory pattern profile and adhesiveness to a substrate. In other words, they are not successful in ensuring satisfactory resist properties.

Furthermore, the photoresist compositions proposed for the purpose of improving dry etching resistance, sensitivity and so on use resins into which alicyclic hydrocarbon groups are introduced, as the resins to be combined with compounds capable of generating acids upon exposure to light. For instance, the photoresist composition using a resin having alicyclic hydrocarbon moieties and acrylate, fumarate, acrylonitrile, maleimide or maleic anhydride moieties in its main chain is proposed in JP-A-10-10739. In JP-A-9-325498 is proposed the photoresist composition using a resin containing norbornane or cyclohexane moieties, which are each substituted with at least one acid group such as carboxylic group, as the alicyclic groups in the main chain. In addition, the photoresist compositions using resins containing norbornane moieties in their main chains are proposed in WO 97/33198 and European Patent 0,789,278. However, those photoresist compositions encounter a new problem that the resist patterns formed have cracks in them; besides, they are insufficient in the adhesiveness to a substrate and cannot ensure a satisfactory profile in the resist pattern.

SUMMARY OF THE INVENTION

Therefore, an object of the present invention is to solve the problems of the above-described conventional photoresist compositions usng, as the resin combined with a compound capable of generating an acid upon exposure to light, resins into which alicyclic hydrocarbon moieties are introduced for the purpose of improving dry etching resistance, sensitivity and so on, and thereby to provide a photoresist composition which is suitable for the use of far ultraviolet light, specifically excimer laser beams, particularly an ArF excimer laser beam, as light source, and not only has excellent dry etching resistance and high sensitivity but also forms resist patterns having substantially no cracks therein, sufficiently high adhesiveness to a substrate and excellent profile.

As a result of our intensive studies of constituent materials for positive resist compositions of chemical amplification type, it has been found that the above object of the present invention can be attained by the combination of a resin comprising repeating units having a particular structure and constitutional units having an alicyclic structure with a photoacid generator, thereby achieving the present invention.

More specifically, the above object is attained with positive photoresist compositions according to the embodiments as described below:

(1) A positive photoresist composition for exposure to far ultraviolet light which comprises a resin decomposing by the action of an acid to increase its solubility in an alkali and a compound generating an acid by irradiation with an actinic ray or radiation, the resin decomposing by the action of an acid to increase its solubility in an alkali, comprising a polymer that contains as constitutional repeating units both the units represented by the following formulae (I) and (II) and further has groups decomposing by the action of an acid:

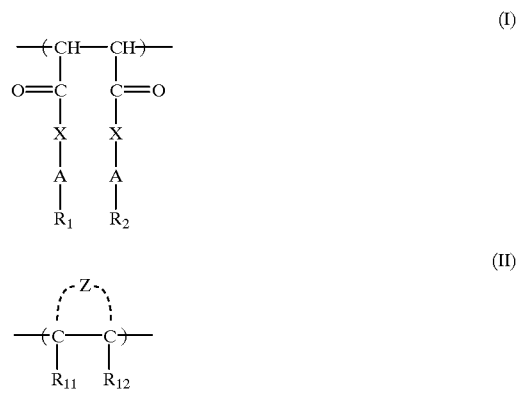

wherein $R_1$ and $R_2$ each independently repersent a hydrogen atom, a cyano group, a hydroxyl group, —COOH, —COOR$_5$, —CO—NH—R$_6$, —CO—NH—SO$_2$—R$_6$, a substituted or unsubstituted alkyl, alkoxy or cyclic hydrocarbon group, or a group —Y; $R_5$ represents a substituted or unsubstituted alkyl or cyclic hydrocarbon group, or a group —Y; the group —Y is represented by

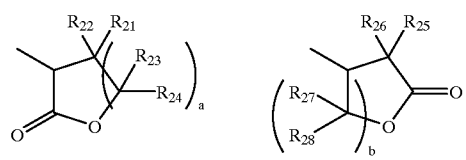

$R_6$ represents a substituted or unsubstituted alkyl or cyclic hydrocarbon group; $R_{21}$ to $R_{28}$ each independently represent a hydrogen atom, or a substituted or unsubstituted alkyl group; a and b are each 1 or 2; $R_{11}$ and $R_{12}$ each independently represent a hydrogen atom, a cyano group, a halogen atom, or a substituted or unsubstituted alkyl group; X represents an oxygen atom, a sulfur atom, —NH—, —NHSO$_2$—, or —NHSO$_2$NH—; A represents a single bond or a divalent linkage group; and Z represents atoms forming a substituted or unsubstituted alicyclic structure together with the two carbon atoms (C—C).

(2) A positive photoresist composition for exposure to far ultraviolet light as described in the above embodiment (1), wherein Z in the formula (II) represents atoms forming a substituted or unsubstituted alicyclic structure having a bridged linkage together with the two carbon atoms (C—C).

(3) A positive photoresist composition for exposure to far ultraviolet light as described in the above embodiment (1), wherein the repeating unit of formula (II) is a repeating unit represented by the following formula (II-A) or (II-B):

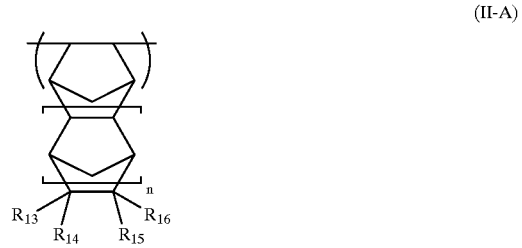

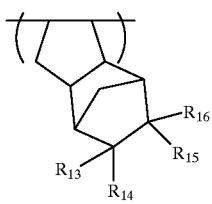

(II-B)

wherein $R_{13}$ to $R_{16}$ each independently represent a hydrogen atom, a halogen atom, a cyano group, —COOH, —COOR$_5$, an acid-decomposable group, —C(=O)—X—A—R$_{17}$ or an unsubstituted or substituted alkyl or cyclic hydrocarbon group, or at least two of the substituents $R_{13}$ to $R_{16}$ combine with each other to form a ring; n is 0 or 1; $R_5$ represents an unsubstituted or substituted alkyl or cyclic hydrocarbon group, or the group —Y as defined in the above embodiment (1); X represents an oxygen atom, a sulfur atom, —NH—, —NHSO$_2$— or —NHSO$_2$NH—; $R_{17}$ represents —COOH, —COOR$_5$, —CN, a hydroxyl group, an unsubstituted or substituted alkoxy group, —CO—NH—R$_6$, —CO—NH—SO$_2$—R$_6$ or the same group Y as defined in the above embodiment (1); $R_6$ has the same meaning as in the above embodiment (1); and A represents a single bond or a divalent linkage group.

DETAILED DESCRIPTION OF THE INVENTION

The compounds used in the present invention are explained in detail below.

Firstly, the resin decomposing by the action of an acid to increase its solubility in an alkaline developer, or the resin comprising a polymer that contains as constitutional repeating units both the units represented by the following formulae (I) and (II) (hereinafter referred to as "the present resin"), is described below.

In the above formula (I), $R_1$ and $R_2$ each independently represent a hydrogen atom, a cyano group, a hydroxyl group, —COOH, —COOR$_5$, —CO—NH—R$_6$, —CO—NH—SO$_2$—R$_6$, a substituted or unsubstituted alkyl, alkoxy or cyclic hydrocarbon group, or the above-described group —Y. $R_6$ represents an unsubstituted or substituted alkyl or cyclic hydrocarbon group. $R_5$ represents a substituted or unsubstituted alkyl or cyclic hydrocarbon group, or the above-described group —Y. $R_{21}$ to $R_{28}$ in the group —Y each independently represent a hydrogen atom, or an unsubstituted or substituted alkyl group. a and b are each 1 or 2. X represents an oxygen atom, a sulfur atom, —NH—, —NHSO$_2$— or —NHSO$_2$NH—. A represents a divalent linkage group.

Suitable examples of an alkyl group represented by $R_1$, $R_2$, $R_5$, $R_6$ and $R_{21}$—$R_{28}$ each include straight-chain and branched alkyl groups containing 1 to 10 carbon atoms, preferably those containing 1 to 6 carbon atoms, and more preferably methyl, ethyl, propyl, isopropyl, n-butyl, isobutyl, sec-butyl and t-butyl groups.

Examples of a cyclic hydrocarbon group represented by $R_1$, $R_2$, $R_5$ and $R_6$ each include a cyclopropyl group, a cyclopentyl group, a cyclohexyl group, an adamantyl group, a 2-methyl-2-adamantyl group, a norbornyl group, a bornyl group, an isobornyl group, a tricyclodecanyl group, a dicyclopentenyl group, a norbornane epoxy group, a menthyl group, an isomenthyl group, a neomenthyl group and a tetracyclododecanyl group.

Examples of an alkoxy group represented by $R_1$ and $R_2$ each include those containing 1 to 4 carbon atoms, such as methoxy, ethoxy, propoxy and butoxy groups.

Examples of a substituent which the above alkyl, cyclic hydrocarbon and alkoxy groups each can have, include a hydroxyl group, a halogen atom, a carboxyl group, an alkoxy group, an acyl group, a cyano group and an acyloxy group. Such a halogen atom includes a chlorine atom, a bromine atom, a fluorine atom and an iodine atom. Such an alkoxy group includes those containing 1 to 4 carbon atoms, e.g., a methoxy group, an ethoxy group, a propoxy group and a butoxy group. Such an acyl group includes a formyl group and an acetyl group, and such an acyloxy group includes an acetoxy group.

Examples of a divalent linkage group represented by A in the formula (I) include an alkylene group, a substituted alkylene group, an ether group, a thioether group, a carbonyl group, an ester group, an amido group, a sulfonamido group, an urethane group, an urea group and groups formed by combining two or more of the above-recited ones.

Examples of an alkylene group or a substituted alkylene group represented by the A include the groups having the following formula;

—[C (R$_a$) (R$_b$)]$_r$— wherein $R_a$ and $R_b$, which may be the same or different, each represent a hydrogen atom, an alkyl group, a substituted alkyl group, a halogen atom, a hydroxyl group or an alkoxy group; and r represents an integer of 1 to 10. The alkyl group suitable for $R_a$ or $R_b$ includes lower alkyl groups, such as methyl, ethyl, propyl, isopropyl and butyl groups. Preferably, the alkyl group is a methyl, ethyl, propyl or isopropyl group. Examples of a substituent present in the substituted alkyl group include a hydroxyl group, a halogen atom and an alkoxy group. The alkoxy group suitable for $R_a$ or $R_b$ includes those containing 1 to 4 carbon atoms, such asmethoxy, ethoxy, propoxy and butoxy groups. The halogen atom suitable for $R_a$ or $R_b$ includes chlorine, bromine, fluorine and iodine atoms.

Examples of a repeating unit represented by the formula (I) include the repeating units [I-1] to [I-65] shown below, but it should be understood that these examples are not to be construed as limiting the scope of the invention in any way.

[I-1]

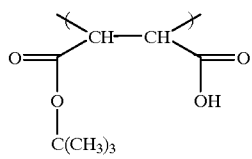

[I-2]

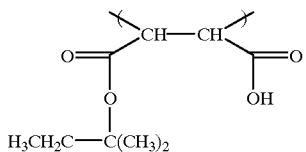

-continued

[I-3]

[I-4]

[I-5]

[I-6]

[I-7]

[I-8]

[I-9]

-continued

[I-10]

[I-11]

[I-12]

[I-13]

[I-14]

[I-15]

[I-16]

[I-17]
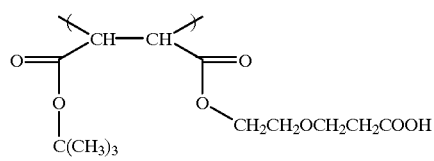
[I-18]
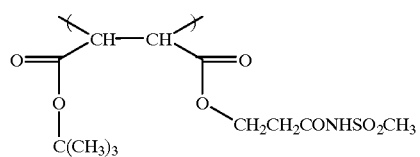
[I-19]
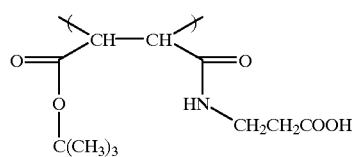
[I-20]
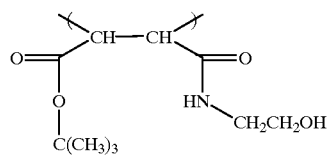
[I-21]
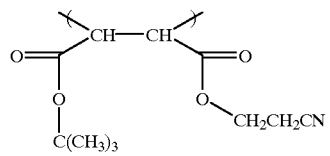
[I-22]
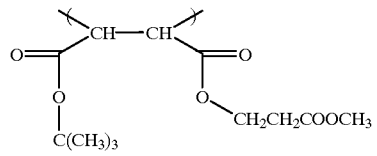
[I-23]
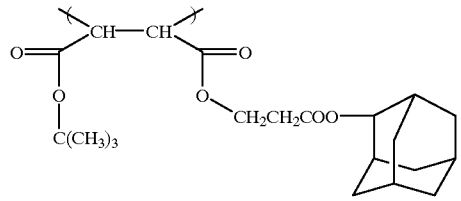
[I-24]
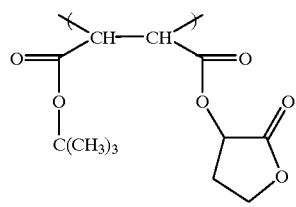
[I-25]
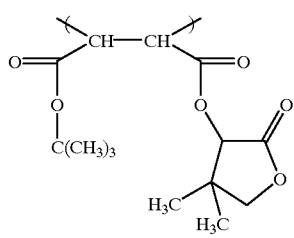
[I-26]
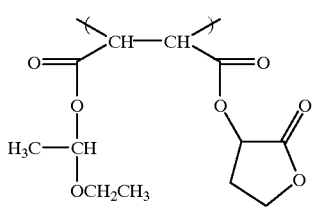
[I-27]
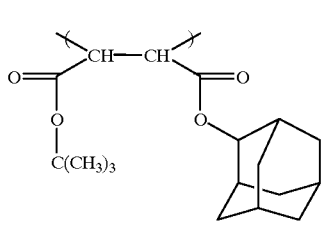
[I-28]
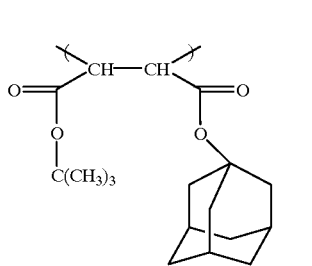
[I-29]
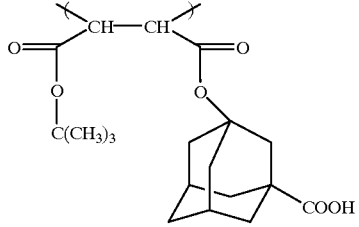
[I-30]
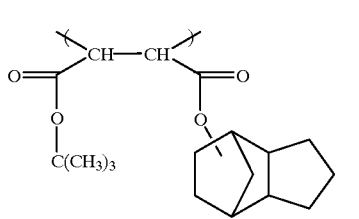

[I-31] 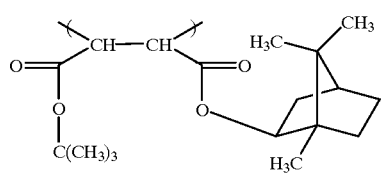
[I-32] 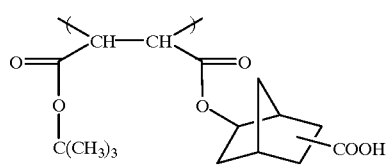
[I-33] 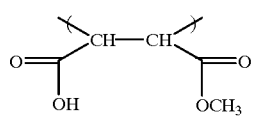
[I-34] 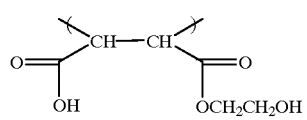
[I-35] 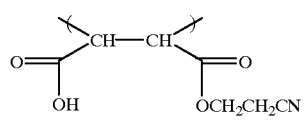
[I-36] 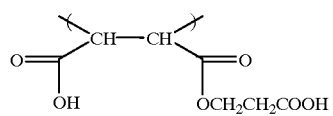
[I-37] 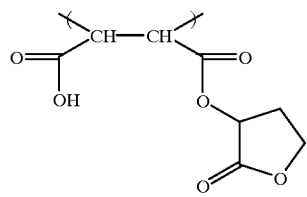
[I-38] 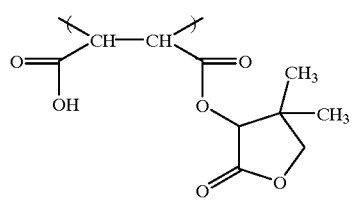
[I-39] 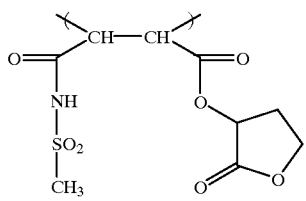
[I-40] 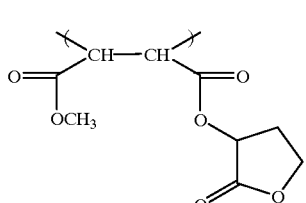
[I-41] 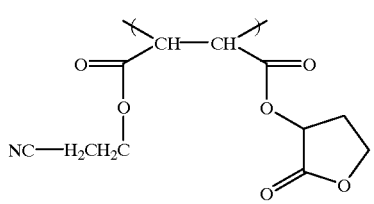
[I-42] 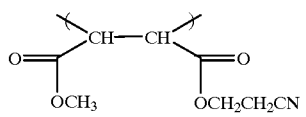
[I-43] 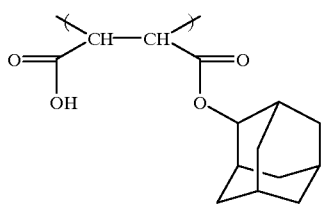
[I-44] 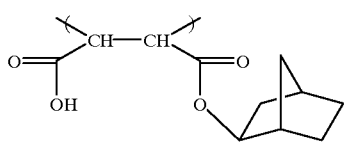
[I-45] 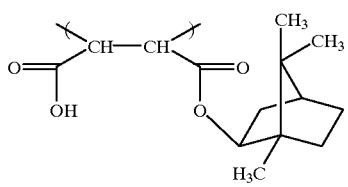
[I-46] 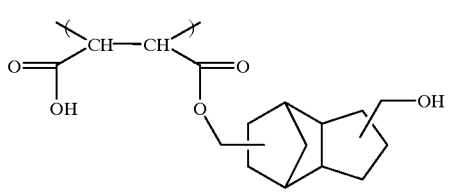

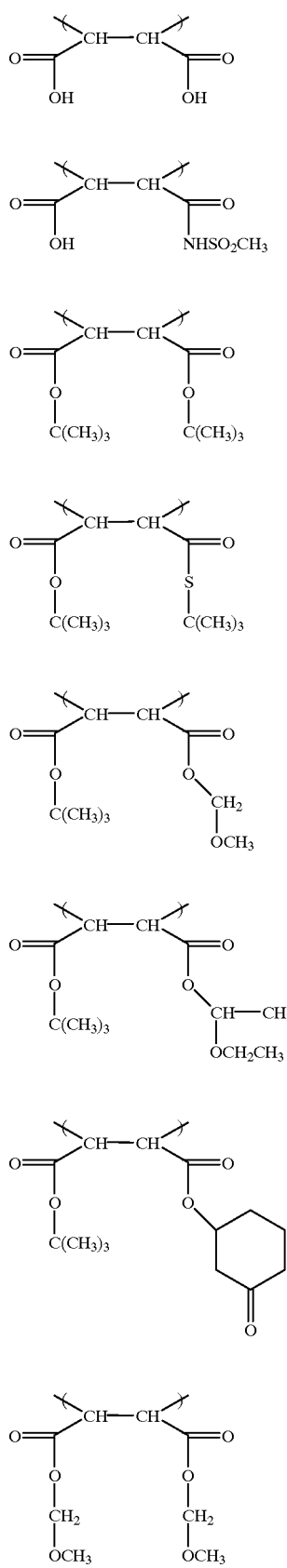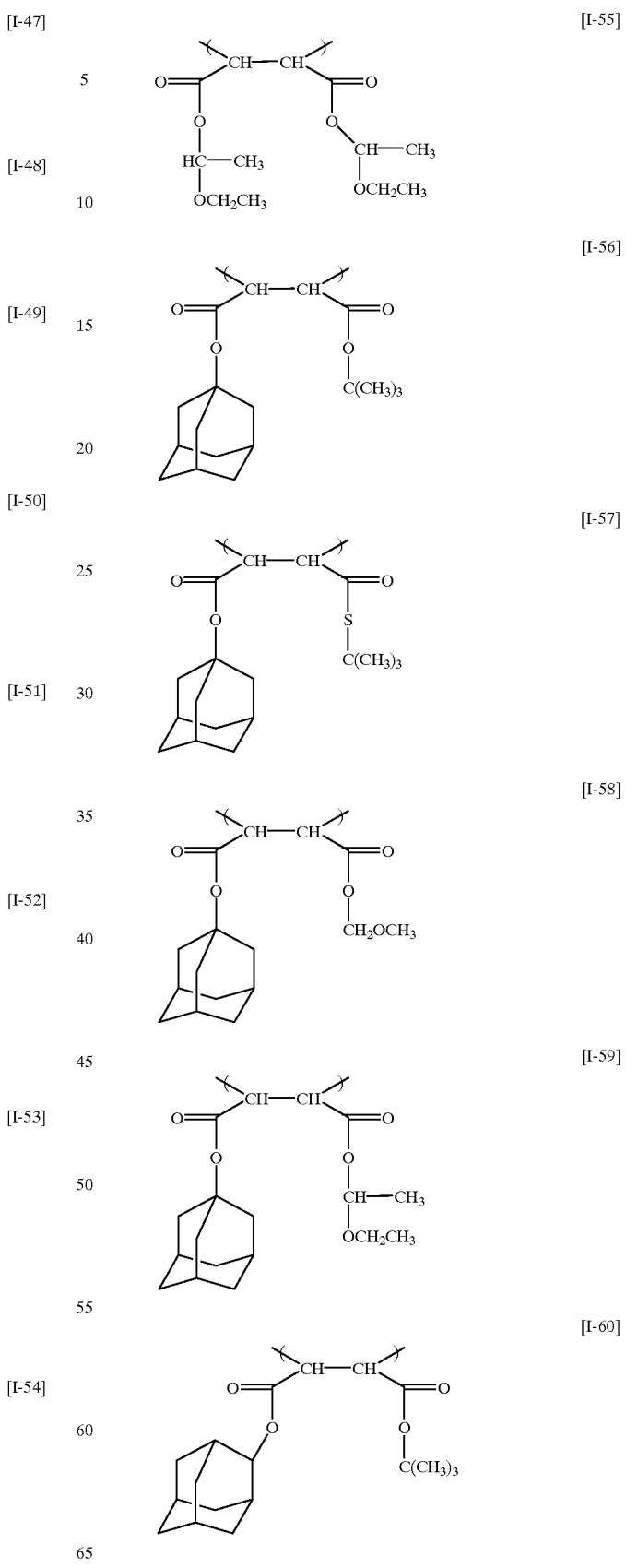

-continued

[I-61]
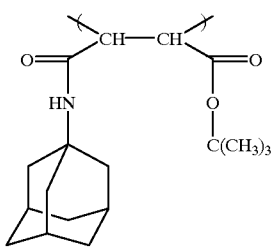

[I-62]
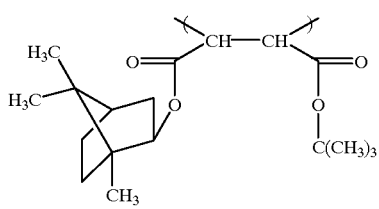

[I-63]
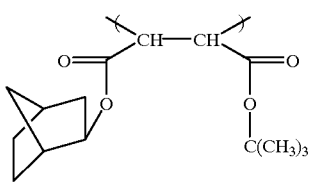

[I-64]
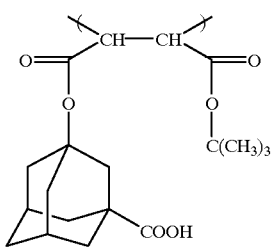

[I-65]
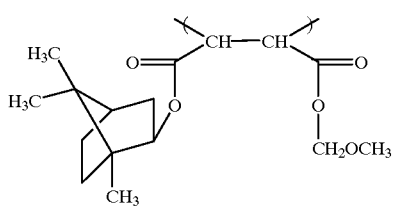

In the above formula (II), $R_{11}$, and $R_{12}$ each independently represent a hydrogen atom, a cyano group, a halogen atom, or an alkyl group which may have a substituent. Z represents atomic groups forming an alicyclic structure, which may have a substituent, together with the two carbon atoms (C—C).

Examples of a halogen atom suitable for $R_{11}$ or $R_{12}$ include chlorine, bromine, fluorine and iodine atoms.

Examples of an alkyl group suitable for $R_{11}$ or $R_{12}$ include straight-chain and branched alkyl groups containing 1 to 10 carbon atoms, preferably straight-chain and branched alkyl groups containing 1 to 6 carbon atoms, more preferably methyl, ethyl, propyl, isopropyl, n-butyl, isobutyl, sec-butyl and t-butyl groups.

Examples of a substituent the alkyl group as $R_{11}$, or $R_{12}$ can further have, include a hydroxyl group, a halogen atom, a carboxyl group, an alkoxy group, an acyl group, a cyano group and an acyloxy group. The halogen atom as the substituent includes chlorine, bromine, fluorine and iodine atoms. The alkoxy group as the substituent includes those containing 1 to 4 carbon atoms, such as methoxy, ethoxy, propoxy and butoxy groups. The acyl group as the substituent includes formyl and acetyl groups. The acyloxy group as the substituent includes an acetoxy group.

The atomic groups for forming an alicyclic structure, which are represented by Z, are atomic groups forming an unsubstituted or substituted alicyclic hydrocarbon as a repeating unit. In particular, the atomic groups for forming an alicyclic structure having a bridged linkage, by which the bridged alicyclic hydrocarbon as a repeating unit is completed, are preferred.

The skeleton of an alicyclic hydrocarbon formed includes those of the structures shown below:

(1)

(2)

(3)
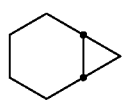

(4)
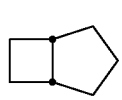

(5)

(6)
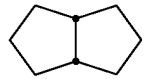

(7)
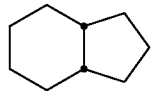

(8)
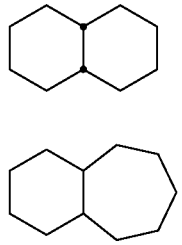

(9)
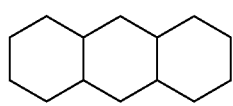

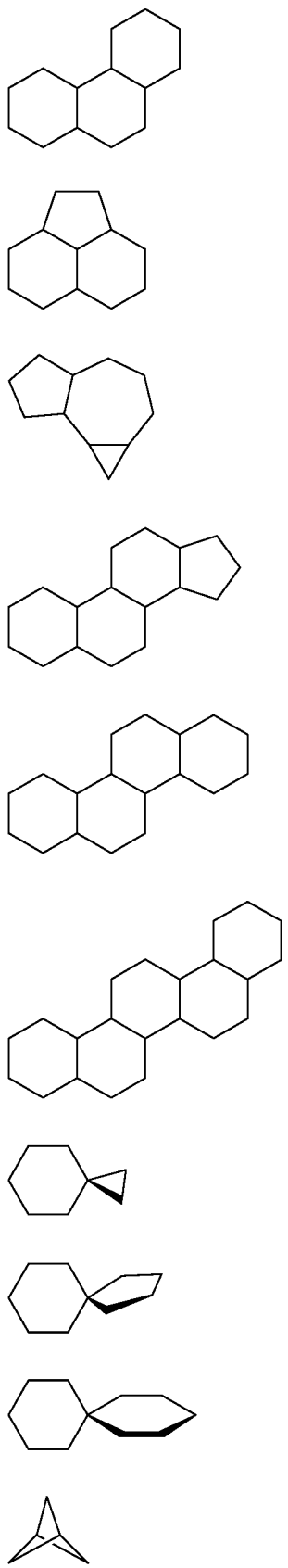
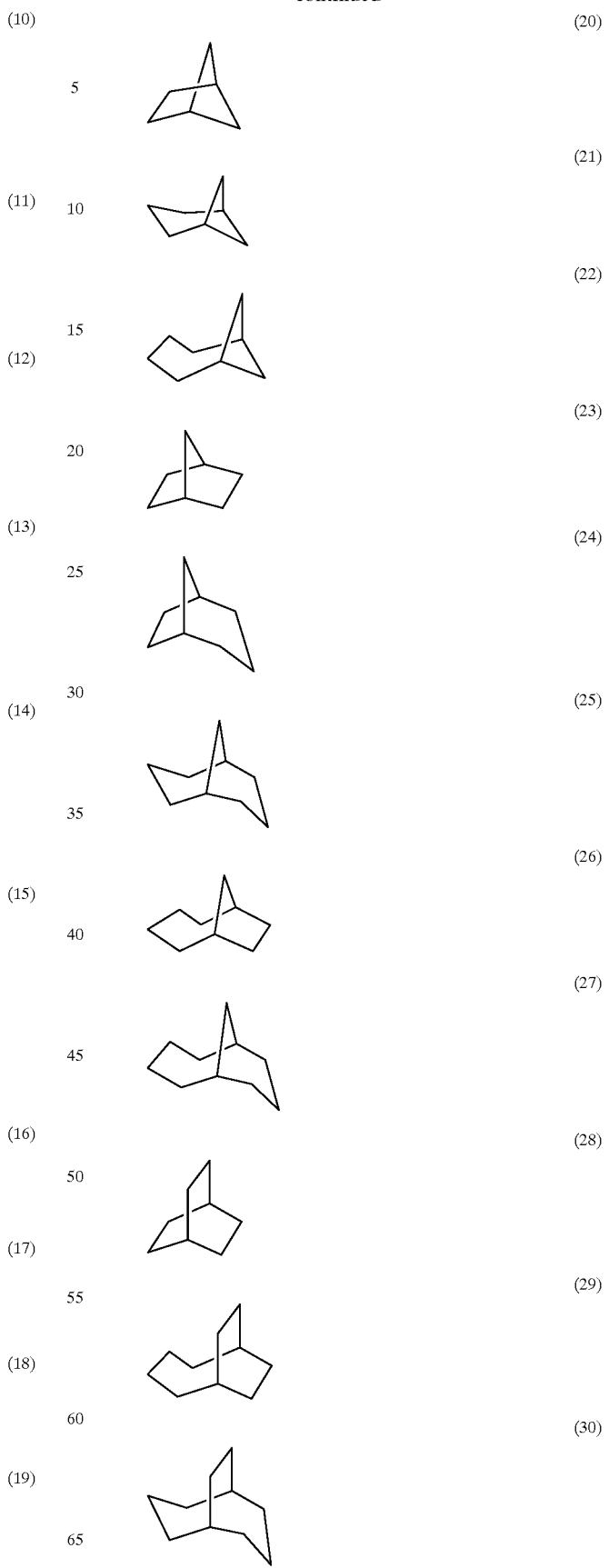

-continued

(31) 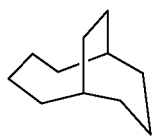

(32) 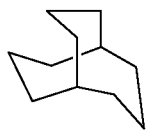

(33) 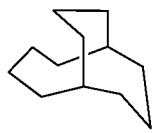

(34) 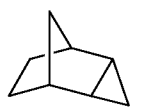

(35) 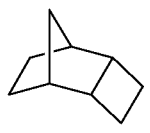

(36) 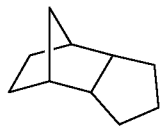

(37) 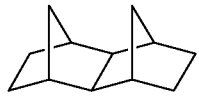

(38) 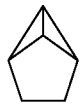

(39) 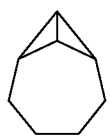

(40) 

(41) 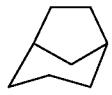

-continued

(42) 

(43) 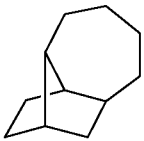

(44) 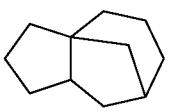

(45) 

(46) 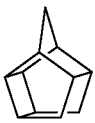

(47) 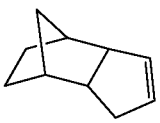

Of the above structures, (5), (6), (7), (9), (10), (13), (14), (15), (23), (28), (36), (37), (42) and (47) are preferable as the bridged alicyclic hydrocarbon skeletons.

The alicyclic hydrocarbon skeletons shown above may have substituents. Examples of such substituents include those represented by $R_{13}$ to $R_{16}$ in the above formula (II-A) or (II-B).

Of the repeating units containing the above bridged alicyclic hydrocarbons, the repeating units represented by the formula (II-A) or (II-B) are further preferable.

In the above formulae (II-A) and (II-B), $R_{13}$ to $R_{16}$ each independently represent a hydrogen atom, a halogen atom, a cyano group, —COOH, —COOR$_5$ (wherein R$_5$ represents an unsubstituted or substituted alkyl or cyclic hydrocarbon group, or the same group —Y as defined in the formula (I)), an acid-decomposable group, —C(=O)—X—A—R$_{17}$ or an unsubstituted or substituted alkyl or cyclic hydrocarbon group. n is 0 or 1. X represents an oxygen atom, a sulfur atom, —NH—, —NHSO$_2$— or —NHSO$_2$NH—. R$_{17}$ represents —COOH, —COOR$_5$, —CN, a hydroxyl group, an unsubstituted or substituted alkoxy group, —CO—NH—R$_6$, —CO—NH—SO$_2$—R$_6$ or the same group —Y as defined in the formula (I) (wherein R$_5$ and R$_6$ are the same as defined above). A represents a single bond or a divalent linkage group.

The acid-decomposable groups in the resin according to the present invention may be included in the above —C(=O)—X—A—R$_1$ and —C(=O)—X—A—R$_2$, or they may be contained as substituents of Z in the formula (II). The structure of such an acid-decomposable group is represented by —C(=O)—X$_1$—R$_0$.

Examples of R$_0$ in the above structural formula include tertiary alkyl groups such as t-butyl and t-amyl groups, an isobornyl group, 1-alkoxyethyl groups such as 1-ethoxyethyl, 1-butoxyethyl, 1-isobutoxyethyl and 1-cyclohexyloxyethyl groups, alkoxymethyl groups such as methoxymethyl and ethoxymethyl groups, a tetrahydropyranyl group, a tetrahydropyranyl group, a trialkylsilyl ester group, and 3-oxocyclohexyl ester group. $X_1$ has the same as defined in the above X.

Examples of a halogen atom for each of the substituents $R_{13}$ to $R_{16}$ include chlorine, bromine, fluorine and iodine atoms.

Examples of an alkyl group for each of the substituents $R_{13}$ to $R_{16}$ include straight-chain and branched alkyl groups containing 1 to 10 carbon atoms, preferably straight-chain and branched alkyl groups containing 1 to 6 carbon atoms, more preferably methyl, ethyl, propyl, isopropyl, n-butyl, isobutyl, sec-butyl and t-butyl groups.

Examples of a cyclic hydrocarbon group for each of the foregoing $R_{13}$ to $R_{16}$ include cyclic alkyl groups and bridged hydrocarbon groups, such as cyclopropyl, cyclopentyl, cyclohexyl, adamantyl, 2-methyl-2-adamantyl, norbornyl, bornyl, isobornyl, tricyclodecanyl, dicyclopentenyl, norbornane epoxy, menthyl, isomenthyl, neomenthyl and tetracyclodecanyl groups.

Examples of a ring formed by combining at least two of the substituents $R_{13}$ to $R_{16}$ include rings containing 5 to 12 carbon atoms, such as cyclopentene, cyclohexene, cycloheptane and cyclooctane rings.

Examples of an alkoxy group for the substituent $R_{17}$ include those containing 1 to 4 carbon atoms, such as methoxy, ethoxy, propoxy and butoxy groups.

Examples of further substituent in the above alkyl, cyclic hydrocarbon and alkoxy groups include a hydroxyl group, a halogen atom, a carboxyl group, an alkoxy group, an acyl group, a cyano group and an acyloxy group. Such a halogen atom includes chlorine, bromine, fluorine and iodine atoms. Such an alkoxy group includes those containing 1 to 4 carbon atoms, e.g., methoxy, ethoxy, propoxy and butoxy groups. Such an acyl group is, e.g., a formyl or acetyl group. Such an acyloxy group is, e.g., an acetoxy group.

Examples of a divalent linkage group as the above A include, similar to the divalent linkage group as the A in the formula (I), a single bond, an alkylene group, a substituted alkylene group, an ether group, a thioether group, a carbonyl group, an ester group, an amido group, a sulfonamido group, an urethane group, an urea group and combinations of two or more of the above-recited groups. Examples of an alkylene group or a substituted alkylene group represented by the above A include the groups having the following formula:

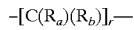

—[C($R_a$)($R_b$)]$_r$— wherein $R_a$ and $R_b$, which may be the same or different, each represent a hydrogen atom, an alkyl group, a substituted alkyl group, a halogen atom, a hydroxyl group or an alkoxy group; and r represents an integer of 1 to 10. The alkyl group suitable for $R_a$ or $R_b$ includes lower alkyl groups, such as methyl, ethyl, propyl, isopropyl and butyl groups. Preferably, the alkyl group is a methyl, ethyl, propyl or isopropyl group. Examples of a substituent present in the substituted alkyl group include a hydroxyl group, a halogen atom and an alkoxy group. The alkoxy group suitable for $R_a$ or $R_b$ includes those containing 1 to 4 carbon atoms, such as methoxy, ethoxy, propoxy and butoxy groups. The halogen atom suitable for $R_a$ or $R_b$ includes chlorine, bromine, fluorine and iodine atoms.

In the present resin, the acid-decomposable group may be present in at least either the repeating unit of formula (I) or (II), or the repeating unit of the copolymerizing component described hereinafter.

The various substituents as $R_{13}$ to $R_{16}$ in the formula (II-A) or (II-B) become the atomic groups for forming an alicyclic structure in the formula (II) or the substituents of the atomic group Z for forming a bridged alicyclic structure.

Examples of a repeating unit represented by the formula (II-A) or (II-B) include the repeating units [II-1] to [II-166] shown below, but it should be understood that these examples are not to be construed as limiting the scope of the invention in any way.

[II-1]

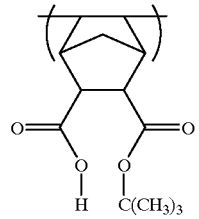

H    C(CH$_3$)$_3$

[II-2]

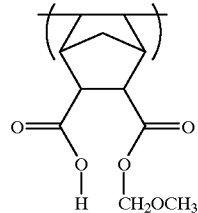

H    CH$_2$OCH$_3$

[II-3]

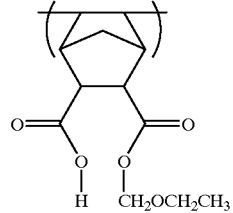

H    CH$_2$OCH$_2$CH$_3$

[II-4]

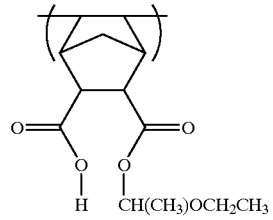

H    CH(CH$_3$)OCH$_2$CH$_3$

[II-5]

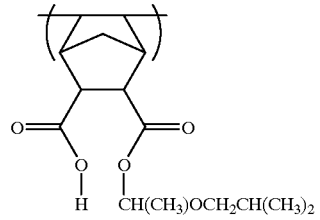

H    CH(CH$_3$)OCH$_2$CH(CH$_3$)$_2$

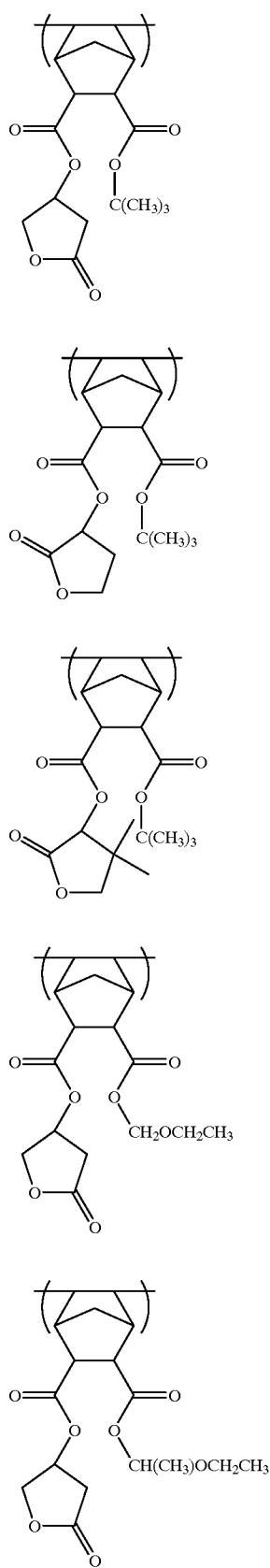
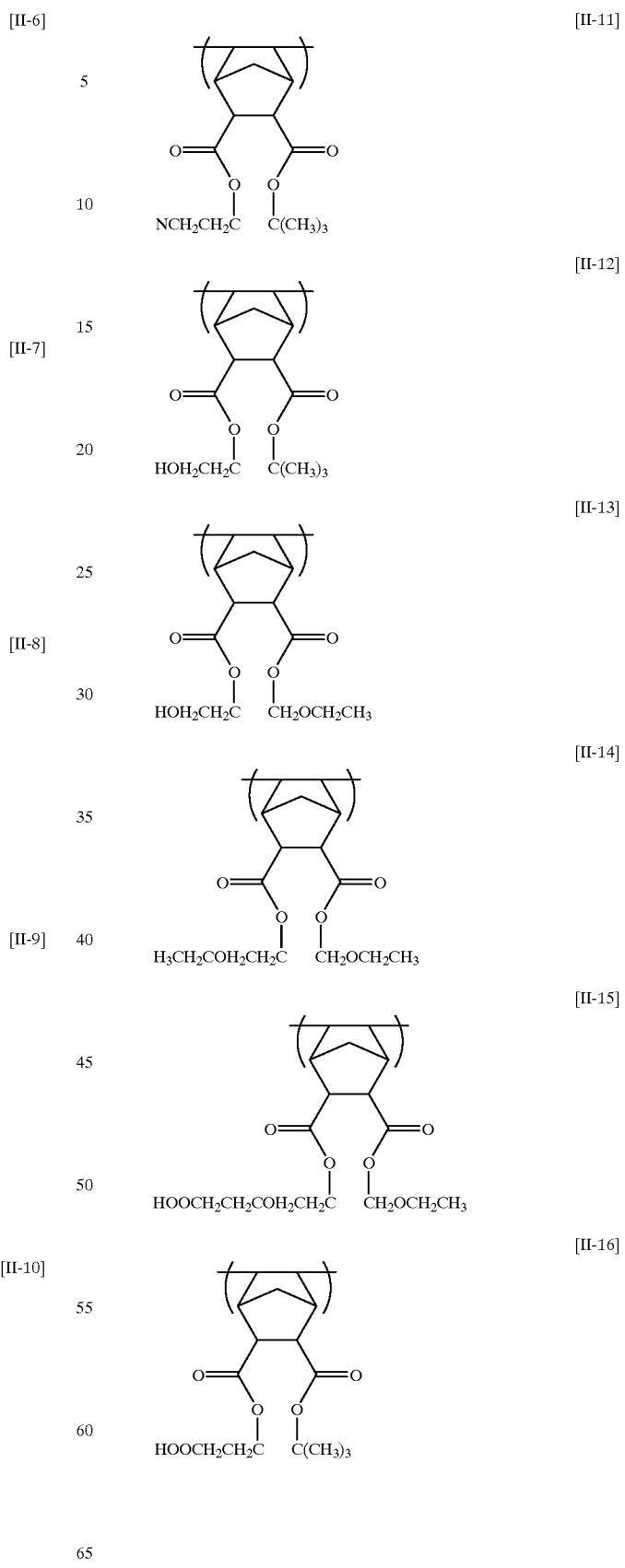

[II-17] 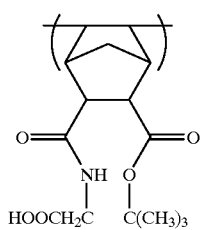
[II-18] 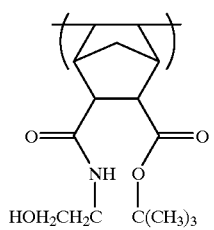
[II-19] 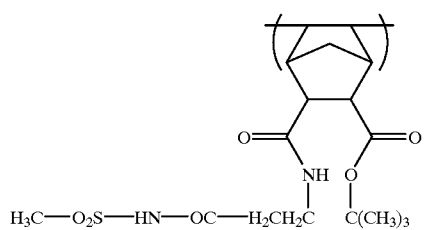
[II-20] 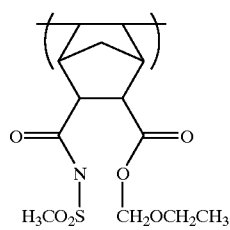
[II-21] 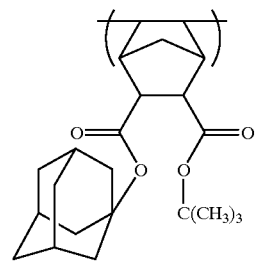
[II-22] 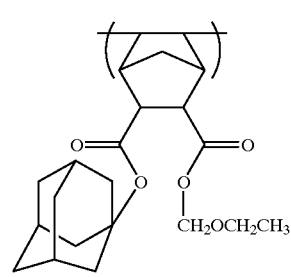
[II-23] 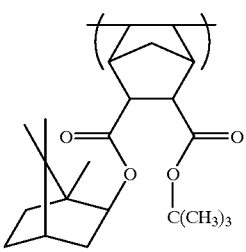
[II-24] 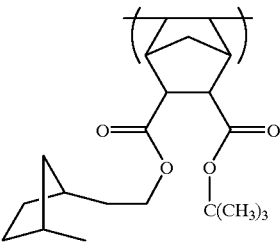
[II-25] 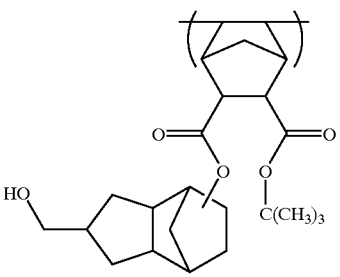
[II-26] 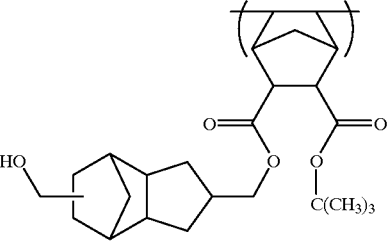
[II-27] 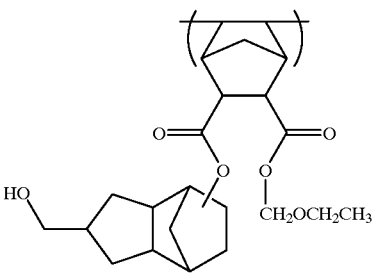

[II-28] 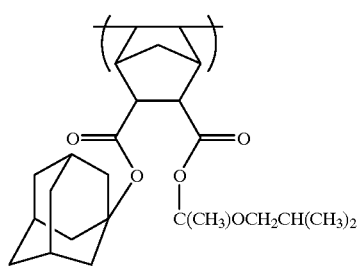
[II-29] 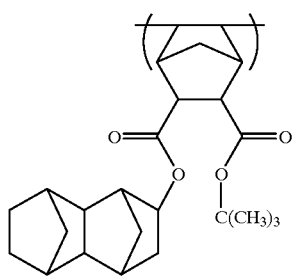
[II-30] 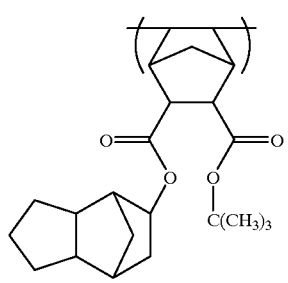
[II-31] 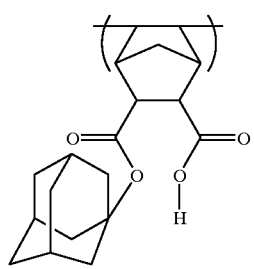
[II-32] 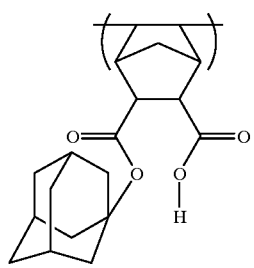
[II-33] 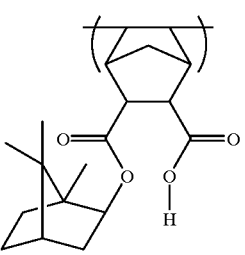
[II-34] 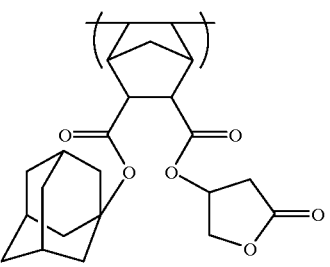
[II-35] 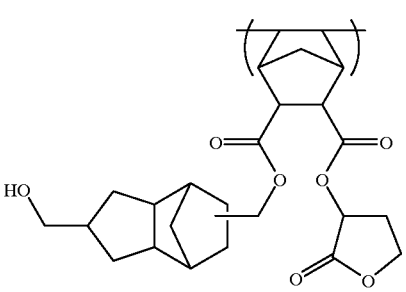
[II-36] 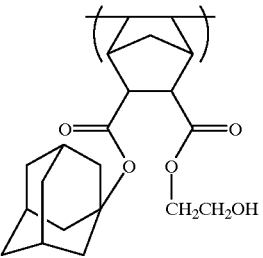
[II-37] 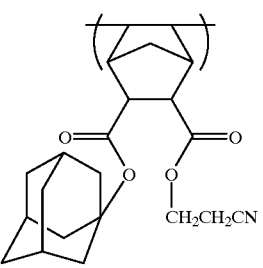

[II-38] 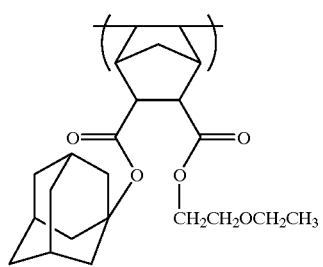
[II-39] 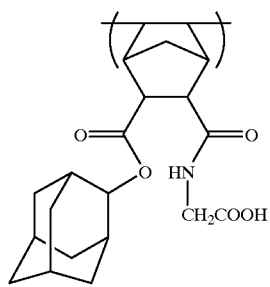
[II-40] 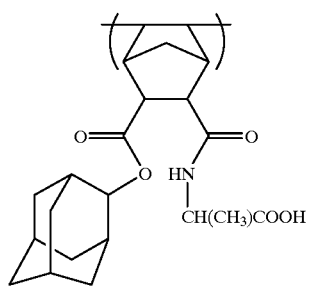
[II-41] 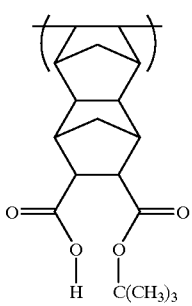
[II-42] 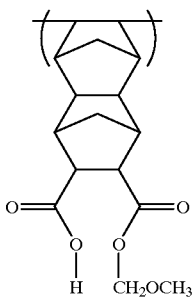
[II-43] 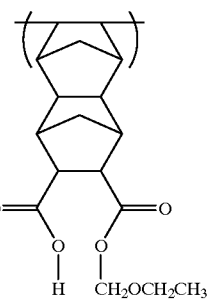
[II-44] 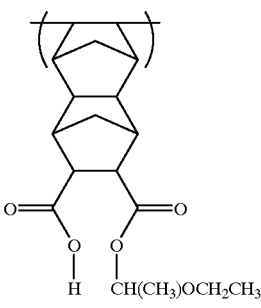
[II-45] 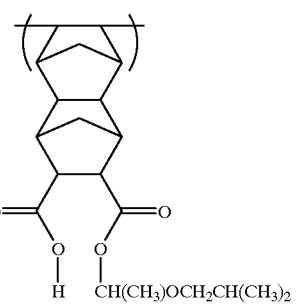
[II-46] 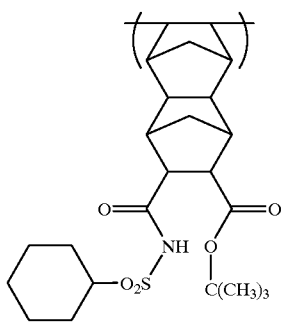
[II-47] 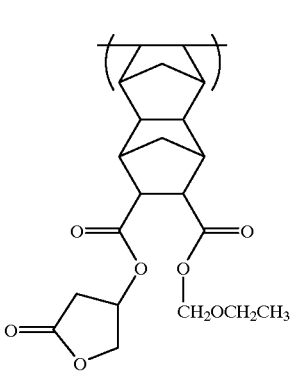

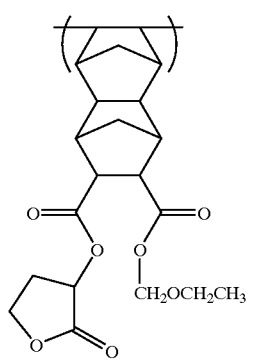
[II-48]
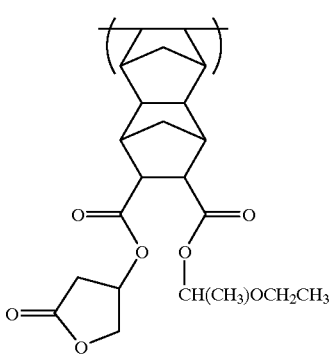
[II-49]
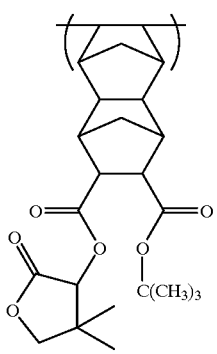
[II-50]
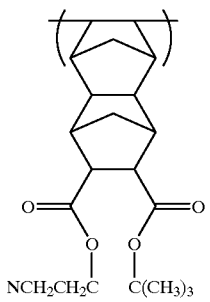
[II-51]
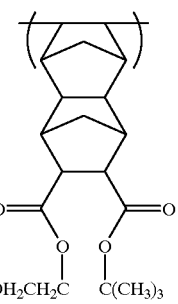
[II-52]
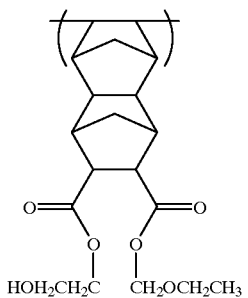
[II-53]
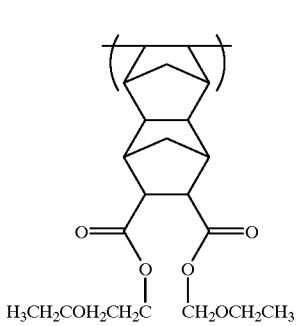
[II-54]
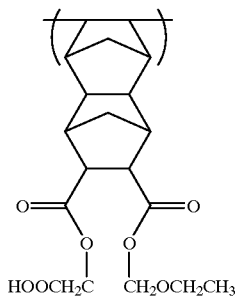
[II-55]
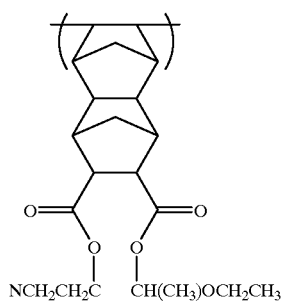
[II-56]

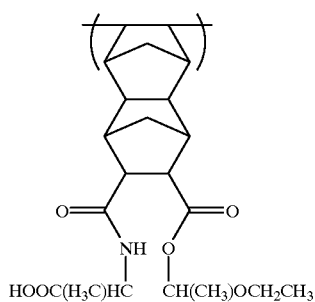
[II-57]
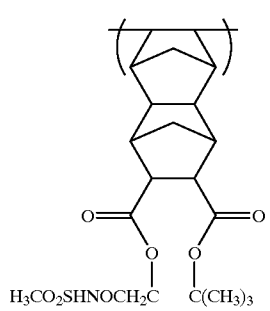
[II-58]
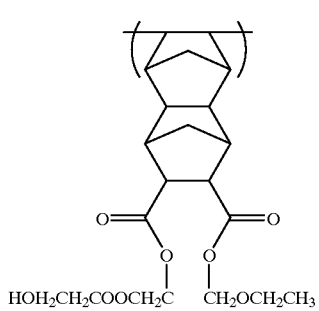
[II-59]
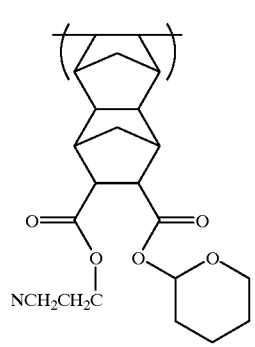
[II-60]
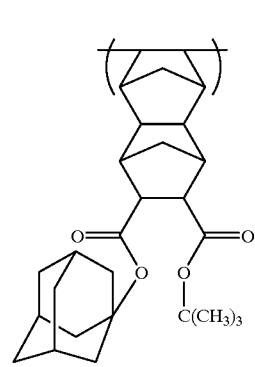
[II-61]
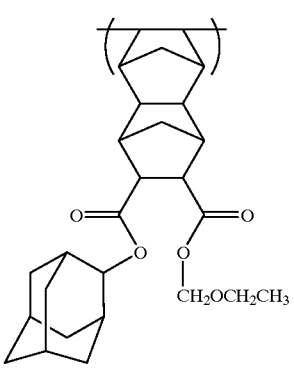
[II-62]
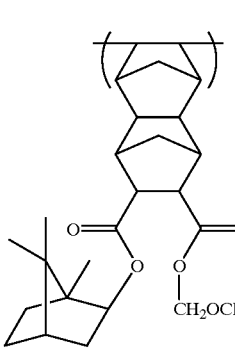
[II-63]
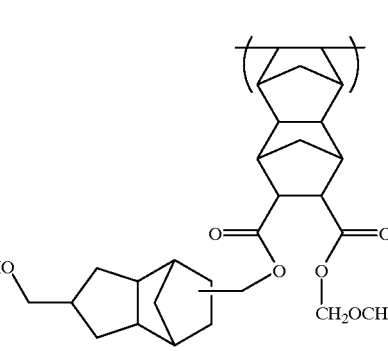
[II-64]
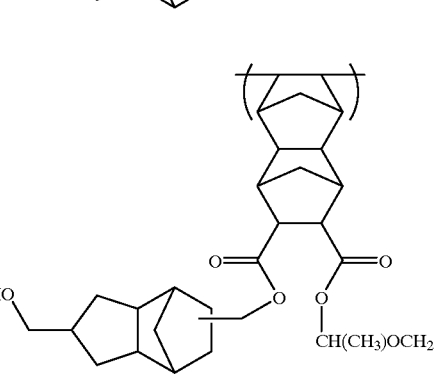
[II-65]

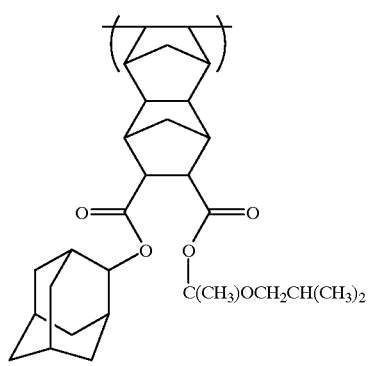 [II-66]
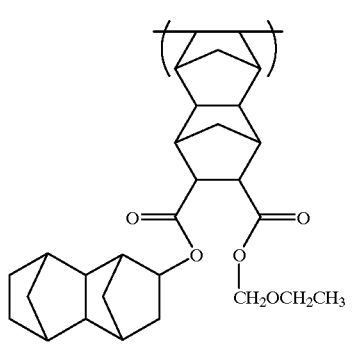 [II-67]
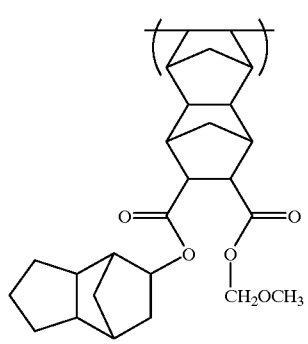 [II-68]
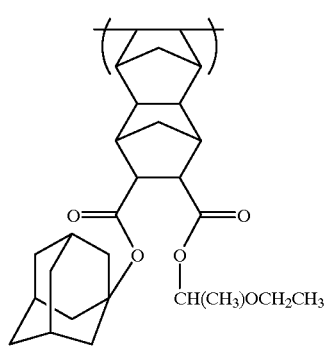 [II-69]
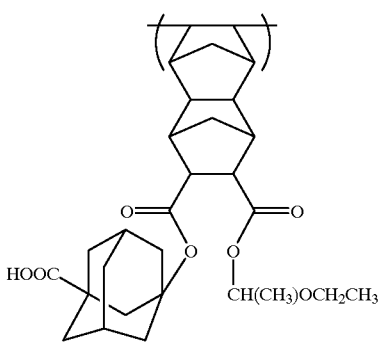 [II-70]
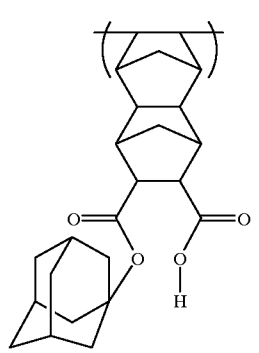 [II-71]
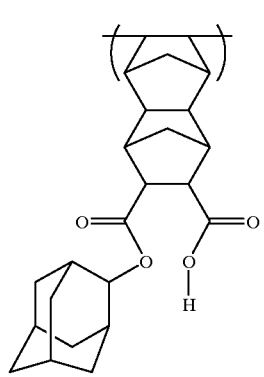 [II-72]
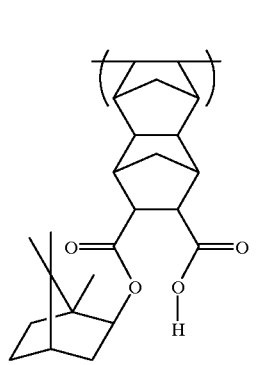 [II-73]

[II-74]
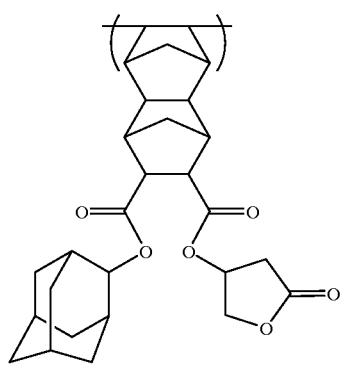
[II-75]
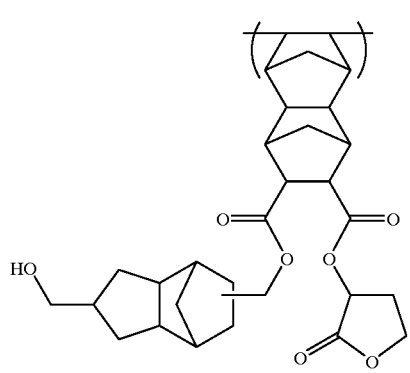
[II-76]
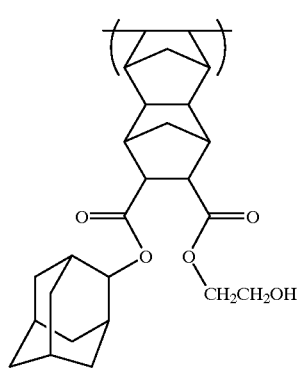
[II-77]
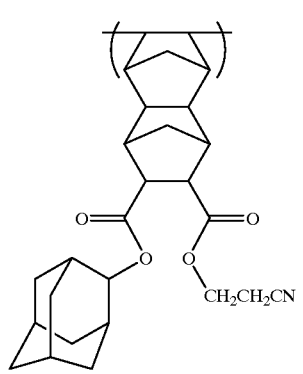
[II-78]
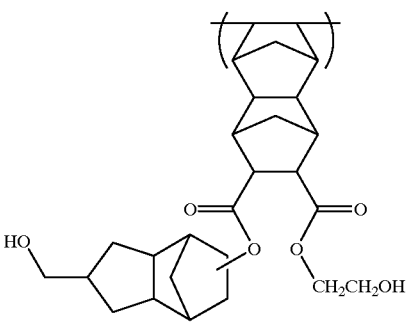
[II-79]
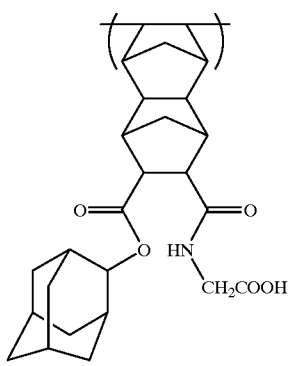
[II-80]
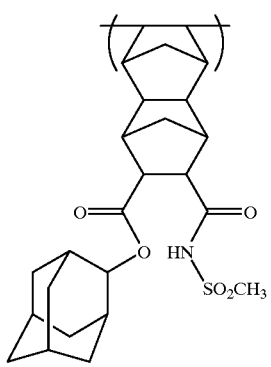
[II-81]
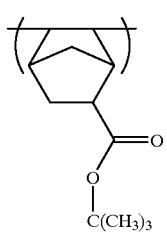
[II-82]
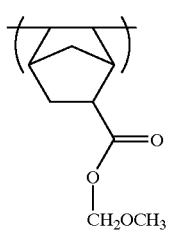

[II-83] 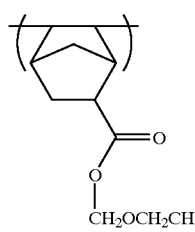
[II-84] 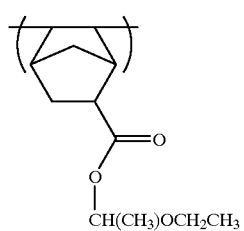
[II-85] 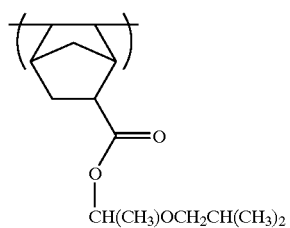
[II-86] 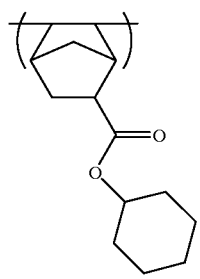
[II-87] 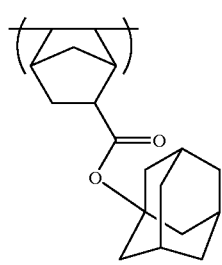
[II-88] 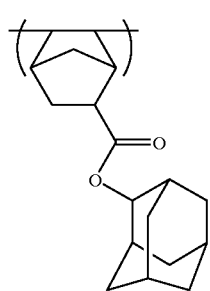
[II-89] 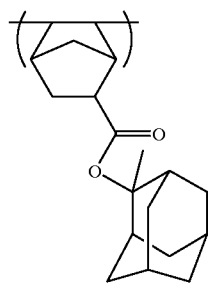
[II-90] 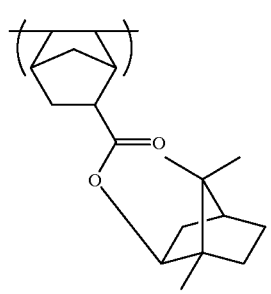
[II-91] 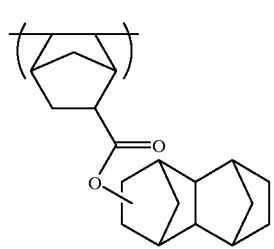
[II-92] 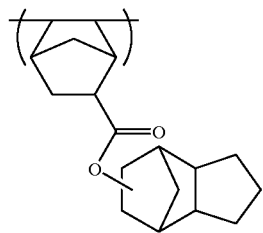
[II-93] 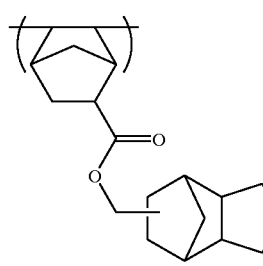

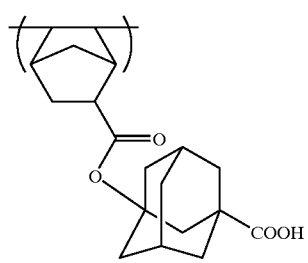
[II-94]
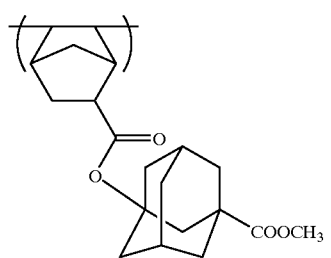
[II-95]
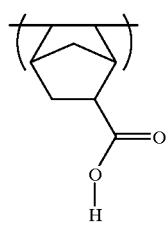
[II-96]
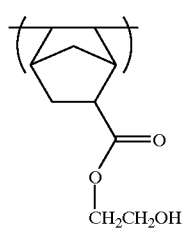
[II-97]
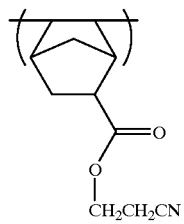
[II-98]
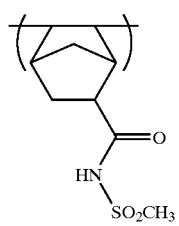
[II-99]
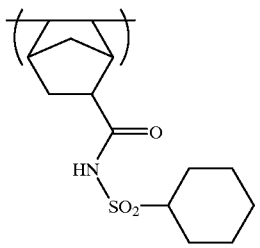
[II-100]
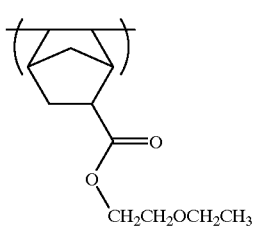
[II-101]
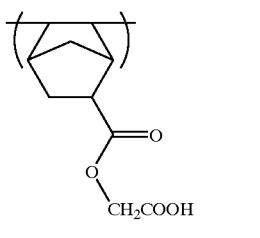
[II-102]
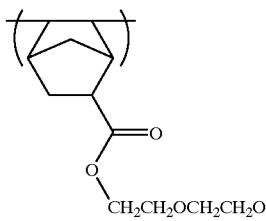
[II-103]
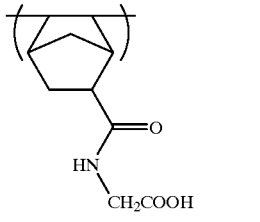
[II-104]
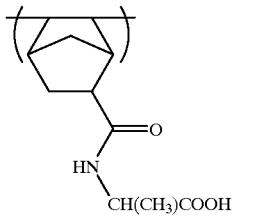
[II-105]

[II-106]
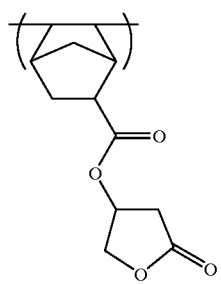
[II-107]
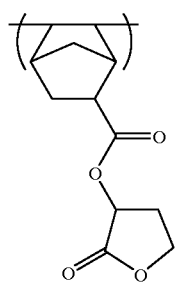
[II-108]
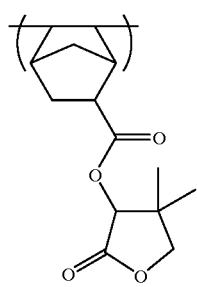
[II-109]
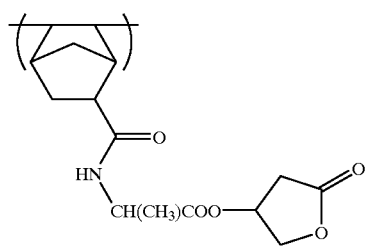
[II-110]
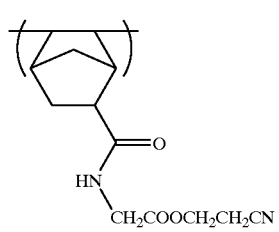
[II-111]
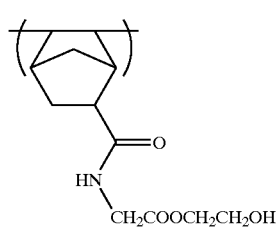
[II-112]
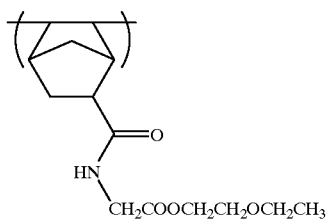
[II-113]
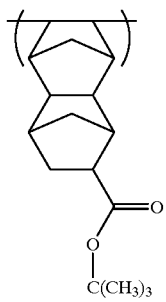
[II-114]
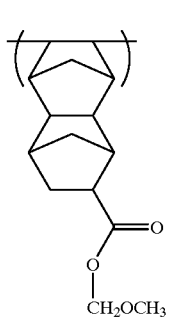
[II-115]
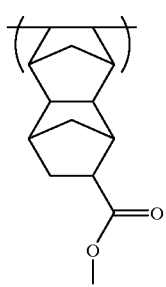
[II-116]
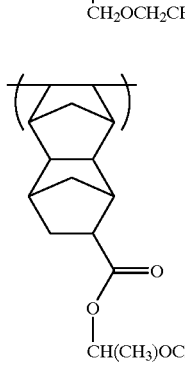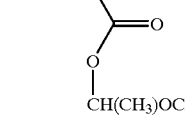

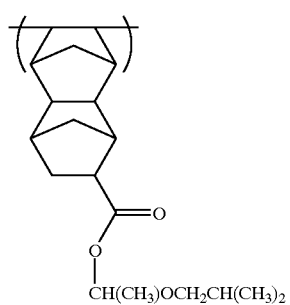
[II-117]
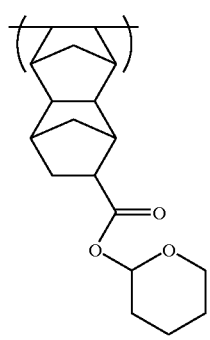
[II-118]
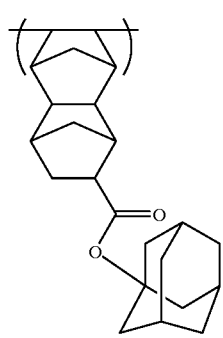
[II-119]
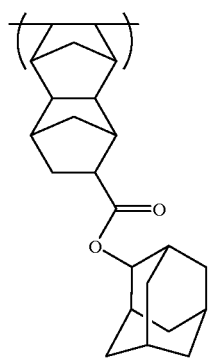
[II-120]
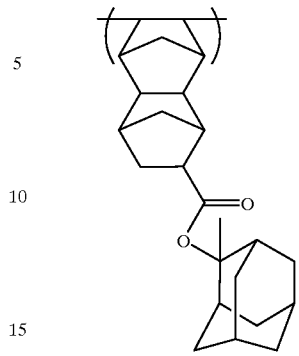
[II-121]
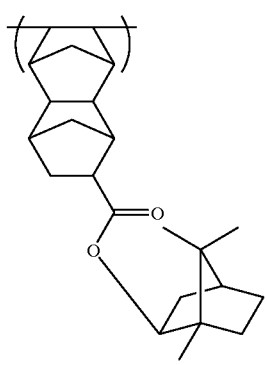
[II-122]
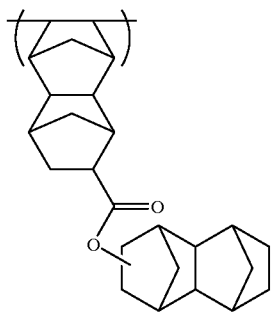
[II-123]
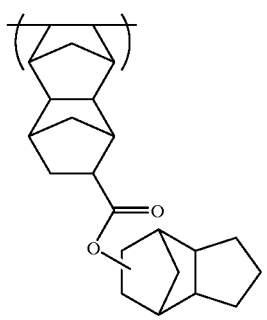
[II-124]

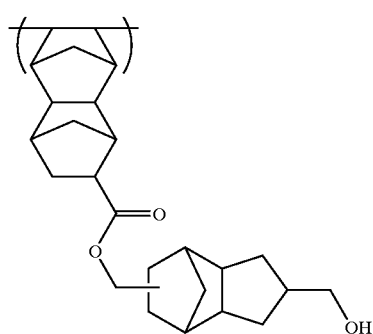
[II-125]
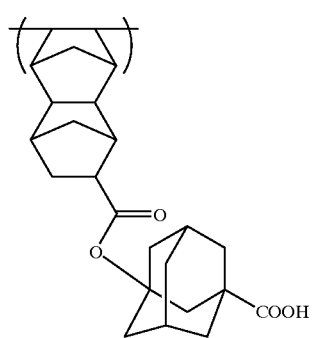
[II-126]
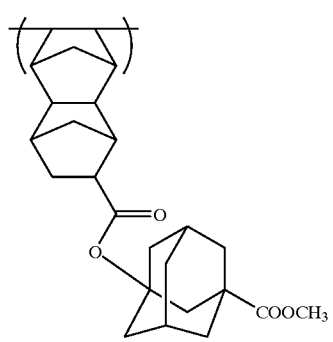
[II-127]
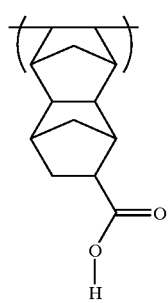
[II-128]
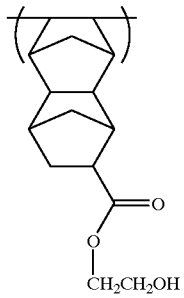
[II-129]
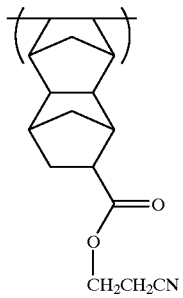
[II-130]
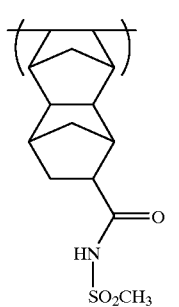
[II-131]
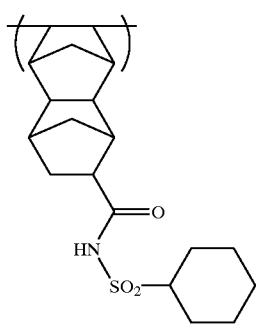
[II-132]
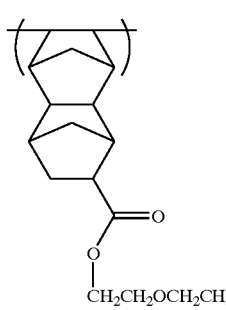
[II-133]

[II-134]
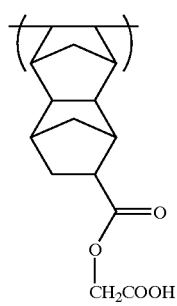
[II-135]
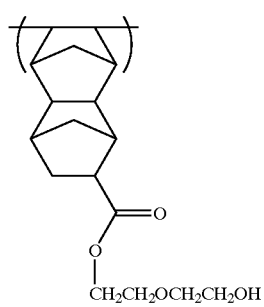
[II-136]
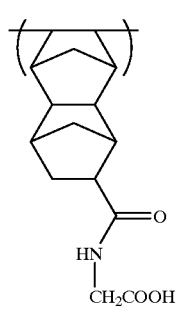
[II-137]
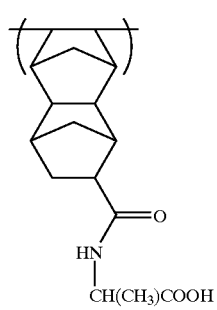
[II-138]
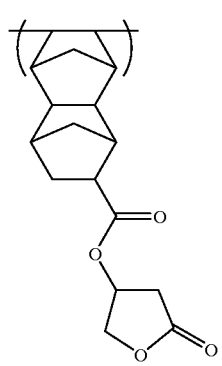
[II-139]
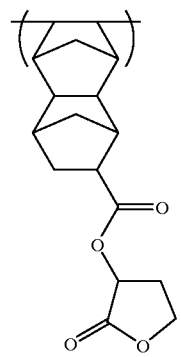
[II-140]
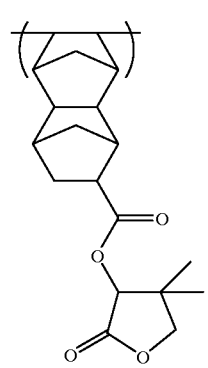
[II-141]
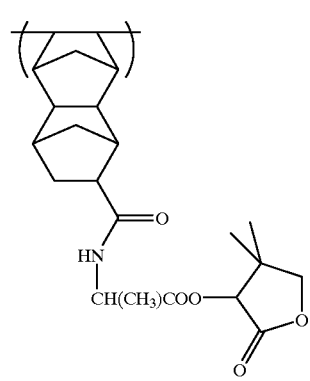
[II-142]
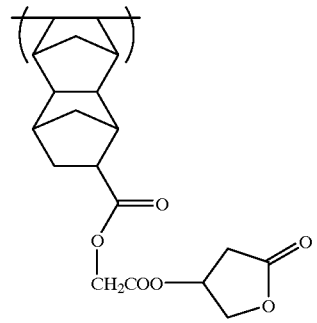

[II-143]
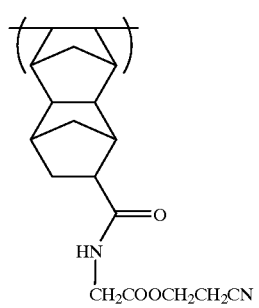
[II-144]
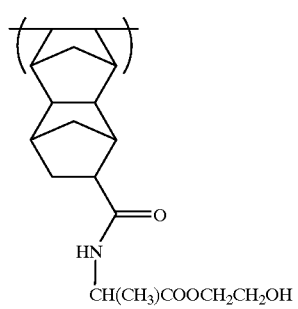
[II-145]
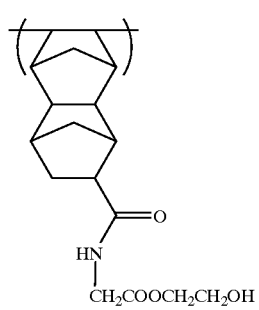
[II-146]
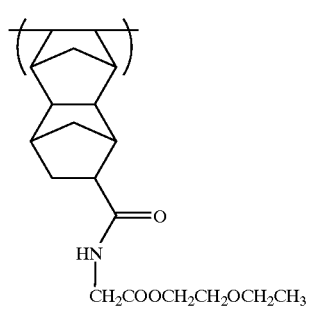
[II-147]
[II-148]
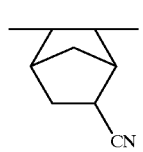
[II-149]
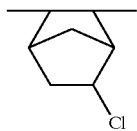
[II-149]
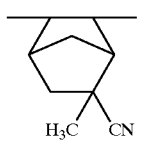
[II-150]
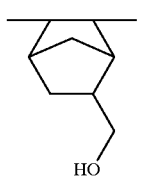
[II-151]
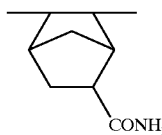
[II-152]
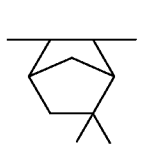
[II-153]
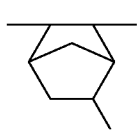
[II-154]
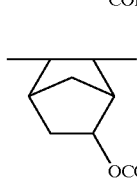
[II-155]
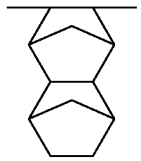
[II-156]
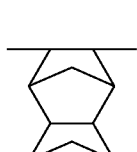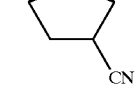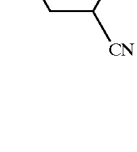

[II-157] 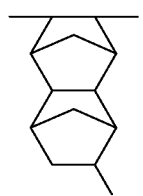

[II-158] 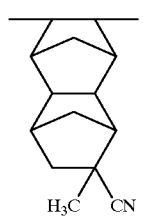

[II-159] 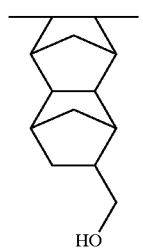

[II-160] 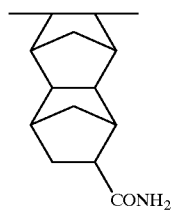

[II-161] 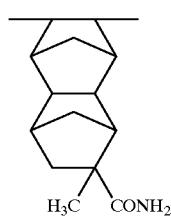

[II-162] 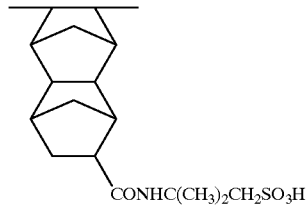

[II-163] 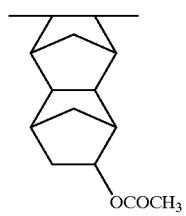

[II-164] 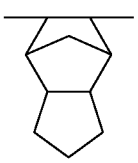

[II-165] 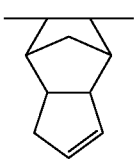

[II-166] 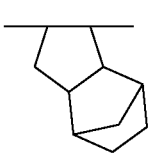

Besides containing one or more repeating units represented by formula (I) and one or more repeating units represented by formula (II) (including formulae (II-A) and (II-B)), the resin of the present invention can contain repeating units derived from various monomers for the purposes of controlling dry etching resistance, suitability for standard developers, adhesiveness to a substrate and resist profile, and further meeting general requirements for resist, such as resolution, heat resistance and sensitivity.

Examples of a copolymerizing component suitable for such purposes include the repeating units represented by the following formulae (IV') and (V'):

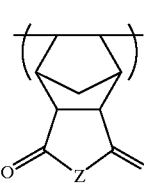

[IV']

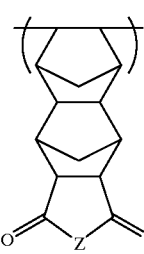

[V']

wherein Z represents an oxygen atom, —NH—, —N($R_3$)— or —N(—OSO$_2$R$_3$)—; and $R_3$ represents the same substituted or unsubstituted alkyl or cyclic hydrocarbon group as recited hereinbefore.

Specific examples of repeating units represented by the above formulae (IV') and (V') respectively include the repeating units [IV'-9] to [IV'-16] shown below and the repeating units [V'-9] to [V'-16] shown below, which are not to be considered as limiting the scope of this invention.

[IV'-9]
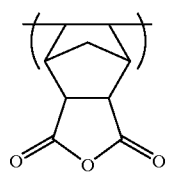
[IV'-10]
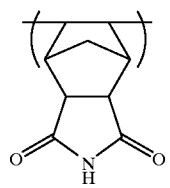
[IV'-11]
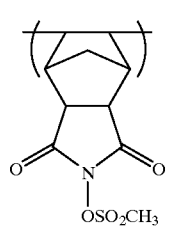
[IV'-12]
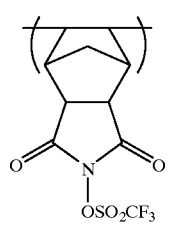
[IV'-13]
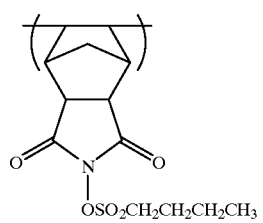
[IV'-14]
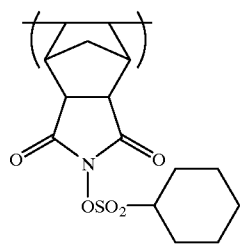
[IV'-15]
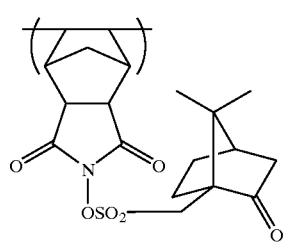
-continued
[IV'-16]
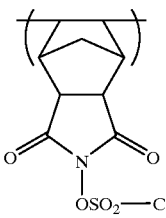
[V'-9]
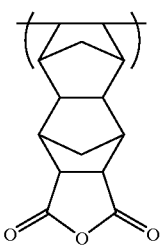
[V'-10]
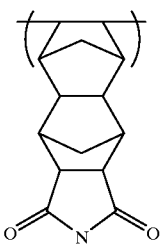
[V'-11]
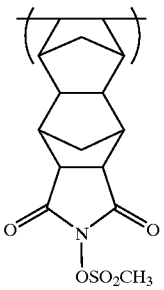
[V'-12]
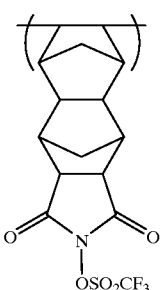

[V'-13]

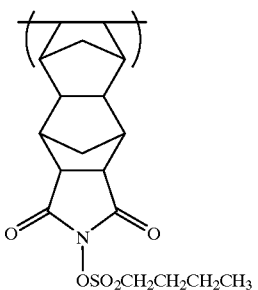
OSO₂CH₂CH₂CH₂CH₃

[V'-14]

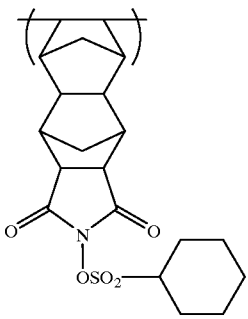
OSO₂—⟨cyclohexyl⟩

[IV'-15]

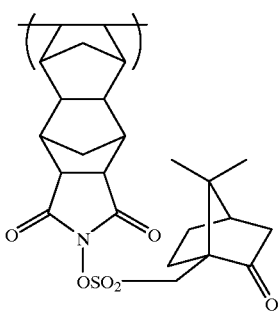
OSO₂—

[V'-16]

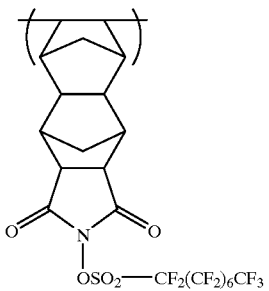
OSO₂—CF₂(CF₂)₆CF₃

In the resin of the present invention, the monomers shown below can be introduced as additional repeating units by copolymerization so long as the effects intended by the present invention can be gained, but the monomers usable for the copolymerization should not be construed as being limited to the recited ones.

The introduction of additional repeating units enables minute control of the properties required for the resins, particularly (1) solubility in a coating solvent, (2) resist film formability (glass transition temperature), (3) alkali developability, (4) reduction in film thickness (hydrophobicity, selection of alkali-soluble groups), (5) adhesiveness to a substrate in the unexposed area and (6) dry etching resistance.

Examples of such copolymerizable monomers include compounds having one addition polymerizable unsaturated bond, such as acrylates, methacrylates, acrylamides, methacrylamides, allyl compounds, vinyl ethers and vinyl esters.

More specifically, the above compounds include:
acrylates, such as alkyl acrylates (preferably those containing a 1–10C alkyl group, e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate);

methacrylates, such as alkylmethacrylates (preferably those containing an alkyl group having 1–10 carbon atomds), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate);

acrylamides, such as acrylamide, N-alkylacrylamides (the alkyl group of which is a 1–10C alkyl group, e.g., methyl, ethyl, propyl, butyl, t-butyl, heptyl, octyl, cyclohexyl, hydroxyethyl), N,N-dialkylacrylamides (the alkyl groups of which are alkyl groups having 1–109 carbon atoms, e.g., methyl, ethyl, butyl, isobutyl, ethylhexyl, cyclohexyl), N-hydroxyethyl-N-methylacrylamide, and N-2-acetamidoethyl-N-acetylacrylamide;

methacrylamides, such as methacrylamide, N-alkylmethacrylamides (the alkyl groups of which are alkyl groups having 1–10 carbon atoms, e.g., methyl, ethyl, t-butyl, ethylhexyl, hydroxyethyl, cyclohexyl), N,N-dialkylmethacrylamides (the alkyl groups of which are, e.g., ethyl, propyl and butyl), and N-hydroxyethyl-N-methylmethacrylamide;

allyl compounds, such as allyl esters (e.g., allyl acetate, allyl caproate, allyl caprate, allyl laurate, allyl palmitate, allyl stearate, allyl benzoate, allyl acetoacetate, allyl lactate) and allyl oxyethanol;

vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether); vinyl esters, such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate and vinyl cyclohexylcarboxylate;

dialkyl itaconates (e.g., dimethyl itaconate, diethyl itaconate, dibutyl itaconate); dialkyl fumarates (e.g., dibuty fumarate) and monoalkyl fumarates; acrylic acid, methacrylic acid, crotonic acid, itaconic acid, maleic anhydride, maleimide, acrylonitrile, methacrylonitrile and maleylonitrile.

In addition to the compounds as described above, any of addition polymerizable unsaturated compounds may be used as comonomers so long as they can be copolymerized with the repeating units represented by formula (I) or (II) (including those represented by formulae (II-A) and (II-B)).

In the resin of the present invention, the proportions of repeating units represented by formula (I) and formula (II) (including formulae (II-A) and (II-B)) can be determined appropriately considering the desired dry etching resistance and sensitivity of the resist obtained, prevention of cracking in resist patterns, adhesiveness to a substrate, resist profile, and further general requirements for resist, such as resolution and heat resistance. The suitable proportion of the respective repeating units of formulae (I) and (II) in the total repeating units of the resin is generally 30 to 70 mole %, preferably 35 to 65 mole %, and more preferably 40 to 60 mole %.

The suitable proportion of the repeating units derived from monomers recited hereinbefore as the desirable copolymerizing component in the resin of the present invention can be determined properly depending on the desired resist properties. In general, it is 99 mole % or less, preferably 90 mole % or less, particularly preferably 80 mole % or less, to the total mole numbers of repeating units of formula (I) and those of formula (II). Also, the suitable proportion of the repeating units derived from monomers recited hereinbefore as the additional copolymerizing component in the resin can be determined properly depending on the desired resist properties. In general, it is 99 mole % or less, preferably 90 mole % or less, particularly preferably 80 mole % or less, to the total mole numbers of repeating units of formula (I) and those of formula (II). If the proportion of the repeating units derived from monomers as the additional copolymerizing component exceeds 99 mole %, the resulting resin cannot fully achieve the effects aimed at by the present invention.

In addition, the resin of the present invention may contain groups decomposing by the action of an acid in any of the repeating units, including the repeating units represented by formulae (I) and (II) and those derived from monomers as copolymerizing component. The suitable proportion of the repeating units having the groups decomposing by the action of an acid in the resin is from 8 to 60 mole %, preferably from 10 to 55 mole %, particularly preferably from 12 to 50 mole %, to the total repeating units of the resin.

The resin of the present invention can be generally synthesized by copolymerizing a monomer corresponding to the repeating unit of formula (II), maleic anhydride and, if needed, monomers as copolymerizing component in the presence of a polymerization catalyst, subjecting the repeating units from maleic anhydride to ring-opening esterification with alcohols or hydrolysis under a basic or acidic condition, and then converting the thus produced carboxylic acid moieties into desired substituent groups.

The resin of the present invention has a weight average molecular weight of preferably from 1,000 to 200,000. The weight average molecular weight lower than 1,000 is not so favorable for the resin to ensure satisfactory heat resistance and dry etching resistance in the resulting resist. Further, the weight average molecular weight higher than 200,000 is also unfavorable, because the resulting resist has inferior developability and low film formability ascribed to very high viscosity of the resin.

The resin of the present invention is characterized by comprising one or more kinds of repeating units represented by formula (I) and one or more kinds of repeating units represented by formula (II) to ensure excellent dry etching resistance and high sensitivity in the photoresist composition, and further to inhibit satisfactorily the resist patterns from cracking, provide sufficient adhesiveness to a substrate, ensure excellent profile in the resist patterns and enable the photoresist composition to acquire suitability for exposure to far ultraviolet light sources, such as excimer laser light sources, especially an ArF excimer light source.

In other words, the resin of the present invention has particular groups as well as a particular main chain skeleton to get improved adhesiveness to a substrate. In both main and side chains it does not contain in a substantial sense any groups showing strong absorption in the far ultraviolet region, so that the exposure light can propagate in the coated film to reach the vicinity of the substrate surface; as a result, the resin can ensure high sensitivity and excellent pattern profile and further prevent the generation of cracking in the resist patterns to further improve the pattern profile. Although low transmission density is an essential requirement, it is not directly bound up with excellent resist characteristics, but it is needless to say that other factors affect them. The resin satisfies essential requirements for not only the transmission density but also other affecting factors.

Each of positive photoresist compositions according to the present invention contains mainly the resin as described above and a photoacid generator. The proportion of the resin in the photoresist composition is from 40 to 99% by weight, preferably from 50 to 97% by weight, to the total solid content in the resist.

Photoacid generators usable in the positive photoresist compositions of the present invention are explained below.

The photoacid generators are required to have two properties, namely (1) being transparent to exposure light (provided that they have no photobleaching properties) and (2) being sufficiently subject to photolysis to secure resist sensitivity. Although a guiding principle in molecular design for meeting these contradictory essential requirements is still unclear on the present situation, the following compounds can be recited as examples.

Specifically, examples of a photoacid generator include the 2-oxocyclohexyl group-containing aliphatic alkylsulfonium salts and the N-hydroxysuccinimidosulfonates as disclosed in JP-A-7-25846, JP-A-7-28237, JP-A-7-926757 and JP-A-8-27102. Further, the description of photoacid generators can be found, e.g., in *J. Photopolym. Sci. Technol.*, vol. 7, No. 3, p. 423 (1994), and sulfonium salts represented by the following formula (VI), disulfones represented by the following formula (VII) and compounds represented by the following formula (VIII) are cited as examples:

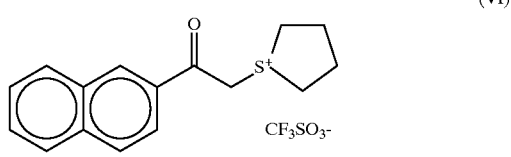

(VI)

(VII)

(VIII)

In the above formulae, $R_{12}$ to $R_{15}$ are each an alkyl group or a cycloalkyl group, and they may be the same or different.

Furthermore, N-hydroxymaleinimidosulfonates of the following formula (IX) are also suitable for photoacid generators:

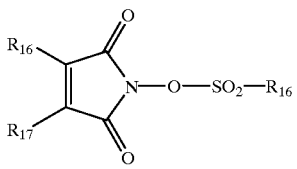
(IX)

In the above formula, $R_{16}$ and $R_{17}$, which may be the same or different, each represent a hydrogen atom, an alkyl group having 1–6 carbon atoms or a cycloalkyl group, or $R_{16}$ and $R_{17}$ combine with each other via an alkylene group to form a ring; and $R_{18}$ represents an alkyl group, a perfluoroalkyl group, a cycloalkyl group or a group derived from a substituted camphor. These N-hydroxymaleinimidosulfonates are especially advantageous with respect to photosensitivity.

Examples of the alkyl group having 1–6 carbon atoms as $R_{16}$ or $R_{17}$ in the above formula (IX) include methyl, ethyl, propyl, isopropyl, n-butyl, isobutyl, tert-butyl, n-pentylandn-hexyl groups. Of these groups, methyl, ethyl and propyl groups are preferred, and methyl and ethyl groups are more preferred. Examples of a cycloalkyl group containing at most 6 carbon atoms include cyclopropyl, cyclopentyl and cyclohexyl groups. Of these groups, cyclopentyl and cyclohexyl groups are preferred. Examples of a case wherein a ring is formed by combining $R_{16}$ with $R_{17}$ via an alkylene chain include the cases of forming cyclohexyl, norbornyl and tricyclodecanyl groups.

Examples of an alkyl group as $R_{18}$ include straight-chain alkyl groups having 1–20 carbon atoms, including methyl, ethyl and propyl groups, and branched alkyl groups having 3 to 20 carbon atoms, including isopropyl, isobutyl, tert-butyl and neopentyl groups. Of these alkyl groups, straight-chain or branched alkyl groups having 1–16 carbon atoms, especially 4–15 carbon atoms, are preferred. Examples of a perfluoroalkyl group as $R_{18}$ include straight-chain perfluoroalkyl groups having 1–20 carbon atoms, including trifluoromethyl and pentafluoroethyl groups, and branched perfluoroalkyl groups having 3–20 carbon atoms, including heptafluoroisopropyl and nonafluoro-tert-butyl groups. Of these perfluoroalkyl groups, straight-chain or branched perfluoroalkyl groups having 1–16 carbon atoms are preferred. Examples of a cycloalkyl group include monocyclic cycloalkyl groups, such as cyclopentyl and cyclohexyl groups, and polycyclic cycloalkyl groups, such as decalyl, norbornyl and tricyclodecanyl groups.

The amount of such a photoacid generator added in the positive photoresist composition is from 0.1 to 20% by weight, preferably from 0.5 to 15% by weight, particularly preferably from 1 to 10% by weight, to the total solid content in the composition.

In the positive photoresist compositions of the present invention, the following photoacid generators may further be used in combination with the above-recited ones.

The amount of the other photoacid generator usable in combination with the above-recited ones in the positive resist composition is 2% by weight or less, preferably 1% by weight or less, to the total solid content in the composition.

Examples of the other photoacid generator include the diazonium salts described, e.g., in S. I. Schlesinger, *Photogr. Sci. Eng.,* 18, 387 (1974), and T. S. Bal et al., *Polymer,* 21, 423 (1980); onium salts, such as the ammonium salts described, e.g., in U.S. Pat. Nos. 4,069,055, 4,069,056 and Re 27,992, and Japanese Patent Application No. 3-140140, the phosphonium salts described, e.g., in D. C. Necker et al., *Macromolecules,* 17, 2468 (1984), C. S. Wen et al., *Teh. Proc. Conf. Rad. Curing ASIA,* p. 478, Tokyo (Oct., 1988), and U.S. Pat. Nos. 4,069,055 and 4,069,056, the iodonium salts described, e.g., in J. V. Crivello et al., *Macromolecules,* 10 (6), 1307 (1977), *Chem. & Eng. News,* Nov. 28, p. 31 (1988), European Patent 104,143, U.S. Pat. Nos. 339,049 and 410,210, JP-A-2-150848 and JP-A-2-296514, the sulfonium salts described, e.g., in J. V. Crivello et al., *Polymer J.,* 17, 73 (1985), J. V. Crivello et al., *J. Org. Chem.,* 43, 3055 (1978), W. R. Watt etal., *J. Polymer Sci.,* Polymer Chem. Ed., 22, 1978 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci.,* Polymer Chem. Ed., 17, 2877 (1979), European Patents 370,693, 3,902,114, 233,567, 297,443 and 297,442, U.S. Pat. Nos. 4,933,377, 161,811, 410,201, 339,049, 4,760,013, 4,734,444 and 2,883,827, and German Patents 2,904,626, 3,604,580 and 3,604,581, the selenonium salts described, e.g., in J. V. Crivello et al., *Macromolecules,* 10 (6), 1307 (1977), and J. V. Crivello et al., *J. Polymer Sci.,* Polymer Chem. Ed., 17, 1047 (1979), and the arsonium salts described, e.g., in C. S. Wen et al., *Teh. Proc. Conf. Rad. Curing ASIA,* p. 478, Tokyo (Oct., 1988); the organic halogeno-compounds described, e.g., in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; the organometallic compounds/organic halides described, e.g., in K. Meier et al., *J. Rad. Curing,* 13 (4), 26 (1986), T. P. Gill etal., *Inorg. Chem.,* 19, 3007 (1980), D. Astruc, *Acc. Chem. Res.,* 19 (12), 377 (1896), and JP-A-2-161445; the photoacid generators having o-nitrobenzyl type protective groups described, e.g., in S. Hayase et al., *J. Polymer Sci.,* 25, 753 (1987), E. Reichmanis et al., *J. Polymer Sci.,* Polymer Chem. Ed., 23, 1 (1985), Q. Q. Zhu et al., *J. Photochem.,* 36, 85, 39, 317 (1987), B. Amit et al., *Tetrahedron Lett.,* (24) 2205 (1973), D. H. R. Barton et al., *J. Chem. Soc.,* 3571 (1965), P. M. Collins et al., *J. Chem. SoC.,* Perkin I, 1695 (1975), M. Rudinstein et al., *Tetrahedron Lett.,* (17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Soc.,* Chem. Commun., 532 (1972), S. Hayase et al., *Macromolecules,* 18, 1799 (1985), E. Reichmanis et al., *J. Electrochem. Soc.,* Solid State Sci. Technol., 130 (6), F. M. Houlihan et al., *Macromolecules,* 21, 2001 (1988), European Pat. Nos. 0,290,750, 0,046,083, 0,156,535, 0,271,851 and 0,388,343, U.S. Pat. Nos. 3,901,710 and 4,181,531, JP-A-60-198538 and JP-A-53-133022; the compounds generating a sulfonic acid on photolysis, which are represented by iminosulfonates, as described, e.g., in M. Tunooka et al., *Polymer Preprints Japan,* 35 (8), G. Berneretal., *J. Rad. Curing,* 13 (4), W. J. Mijs et al., *Coating Technol.,* 55 (697), 45 (1983), Akzo, H. Adachietal., *Polymer Preprints Japan,* 37 (3), European Patents 0,199,672, 0,084,515, 0,044,115 and 0,101,122, U.S. Pat. Nos. 618,564, 4,371,605 and 4,431, 774, JP-A-64-18143, JP-A-2-245756 and Japanese Patent Application No. 3-140109: and the disulfone compounds described, e.g., in JP-A-61-166544.

Besides the photoacid generators as described above, the polymers in the main or side chains of which the above-recited groups or compounds that can generate acids upon exposure are introduced, such as the polymers disclosed, e.g., in M. E. Woodhouse et al., *J. Am. Chem. Soc.,* 104, 5586 (1982), S. P. Pappas et al., *J. Imaging Sci.,* 30 (5), 218 (1986), S. Kondo et al., *Makromol. Chem.,* Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, can be used.

In addition, the compounds capable of generating acids upon exposure to light as disclosed, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 can also be used.

Of the above-recited compounds for the combined use, which can be decomposed by irradiation with actinic rays or radiations to generate acids, the compounds particularly advantageously used are shown below:

(1) Trihalomethyl-substituted oxazole compounds represented by the following formula (PAG1), or trihalomethyl-substituted s-triazine compounds represented by the following formula (PAG2):

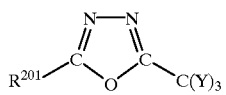
(PAG1)

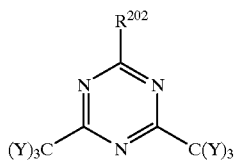
(PAG2)

wherein $R^{201}$ is a substituted or unsubstituted aryl or alkenyl group; $R^{202}$ is a substituted or unsubstituted aryl, alkenyl or alkyl group, or $—C(Y)_3$; and Y is a chlorine or bromine atom.

Examples of such compounds are shown below, but these examples should not be construed as limiting the scope of the present invention.

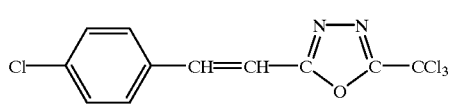
(PAG1-1)

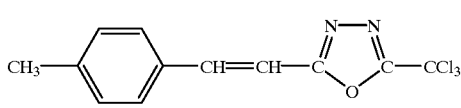
(PAG1-2)

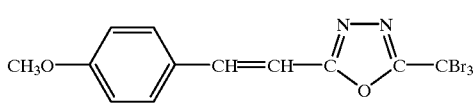
(PAG1-3)

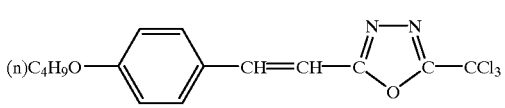
(PAG1-4)

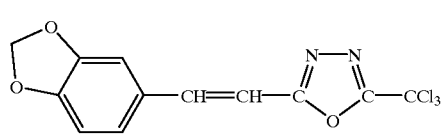
(PAG1-5)

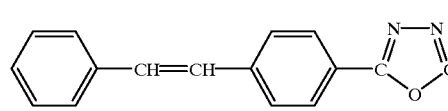
(PAG1-6)

(PAG1-7)

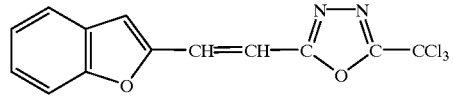

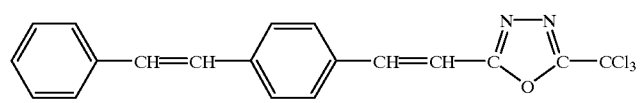
(PAG1-8)

-continued
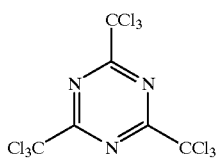
(PAG2-1)
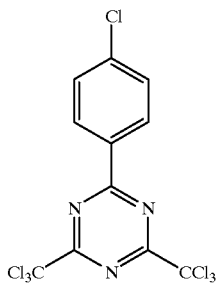
(PAG2-2)
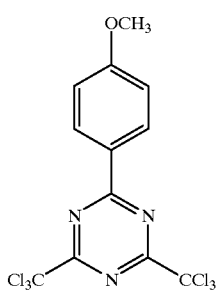
(PAG2-3)
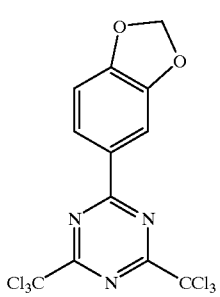
(PAG2-4)
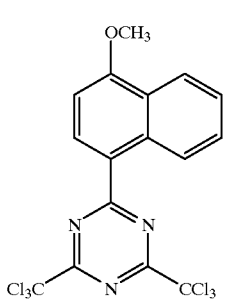
(PAG2-5)

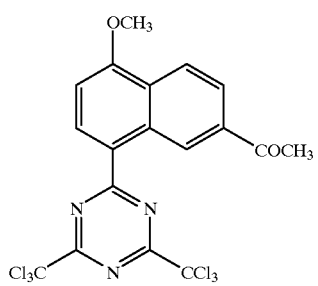 (PAG2-6)
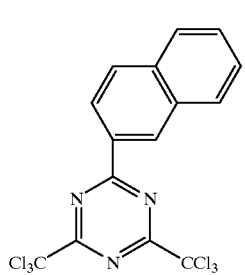 (PAG2-7)
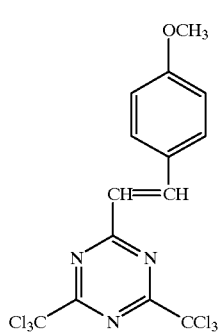 (PAG2-8)
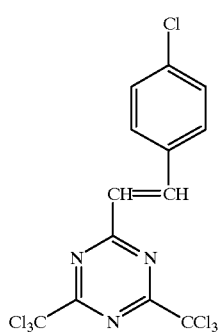 (PAG2-9)

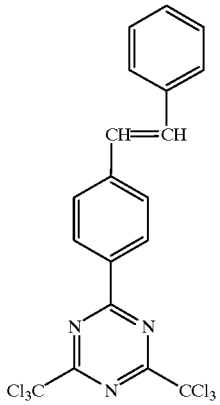

(2) Iodonium salts represented by the following formula (PAG3), or sulfonium salts represented by the following formula (PAG4):

1p;2p

 (PAG3)

(PAG4)

$R^{204}$—$S^+$$Z^-$ with $R^{203}$ and $R^{205}$

In the formula (PAG3), $Ar^1$ and $Ar^2$ are each a substituted or unsubstituted aryl group. Suitable examples of such a substituent include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

In the formula (PAG4), $R^{203}$, $R^{204}$ and R205 are each a substituted or unsubstituted alkyl or aryl group. Preferably, each of them is an aryl group having 6–14 carbon atoms, an alkyl group having 1–8 carbon atoms or their substituted derivatives. Examples of a substituent suitable for the aryl group include an alkoxy group having 1–8 carbon atoms, an alkyl group having 1–8 carbon atoms, a nitro group, a carboxyl group, a hydroxyl group and a halogen atom, and those for the alkyl group include an alkoxy group having 1–8 carbon atoms, a carboxyl group and an alkoxycarbonyl group.

In the above formulae, $Z^-$ is a counter anion, such as a perfluoroalkanesulfonic acid anion, such as $CF_3SO_3^-$, or a pentafluorobenzenesulfonic acid anion.

Further, two among $R^{203}$, $R^{204}$ and $R^{205}$, and two of $Ar^1$ and $Ar^2$ as well, may combine with each other via a single bond or a substituent.

Examples of such compounds are shown below, but these examples should not be construed as limiting the scope of the present invention.

(PAG2-10)

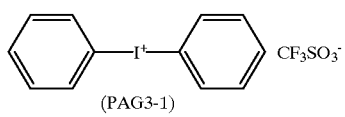
(PAG3-1)

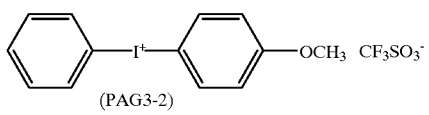
(PAG3-2)

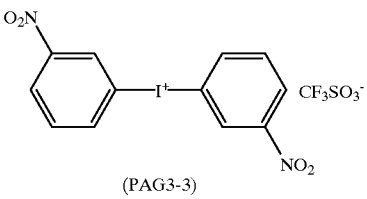
(PAG3-3)

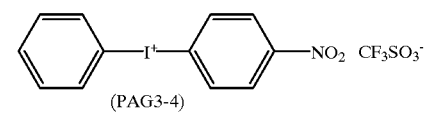
(PAG3-4)

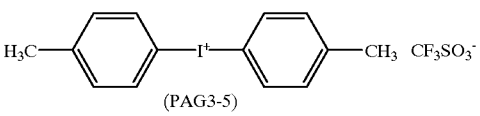
(PAG3-5)

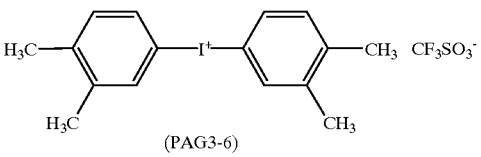
(PAG3-6)

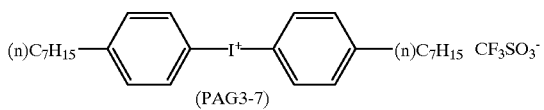
(PAG3-7)

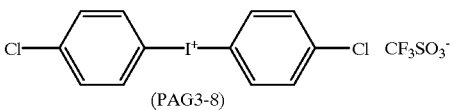
(PAG3-8)

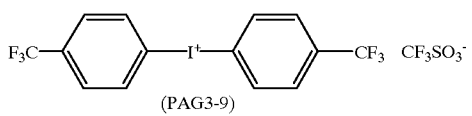
(PAG3-9)
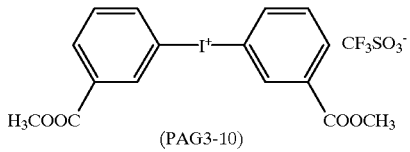
(PAG3-10)
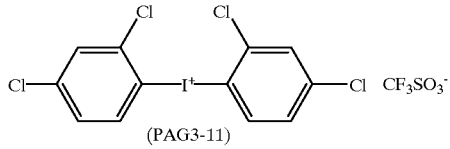
(PAG3-11)
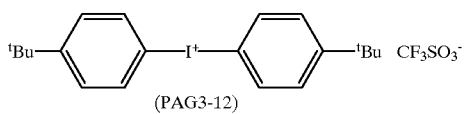
(PAG3-12)
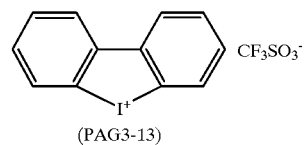
(PAG3-13)
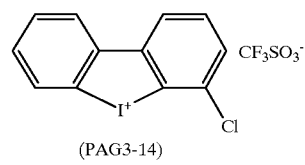
(PAG3-14)
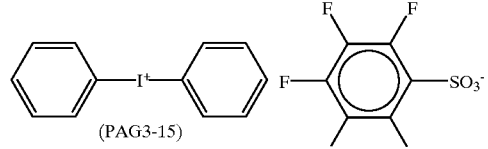
(PAG3-15)
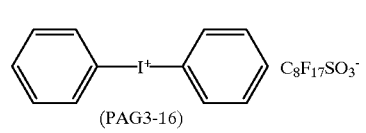
(PAG3-16)
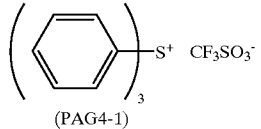
(PAG4-1)
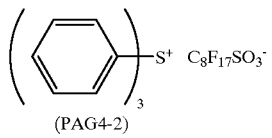
(PAG4-2)
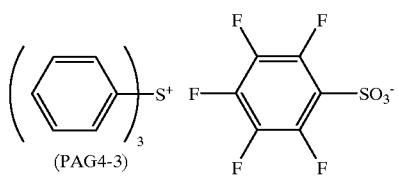
(PAG4-3)
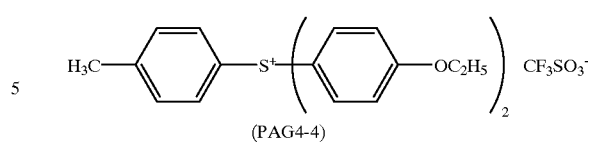
(PAG4-4)
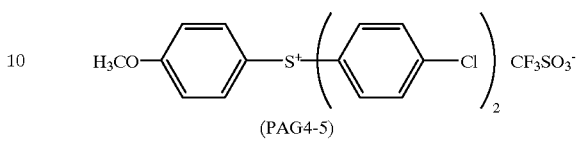
(PAG4-5)
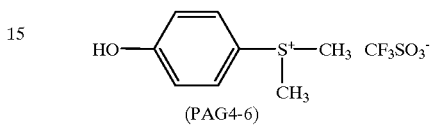
(PAG4-6)
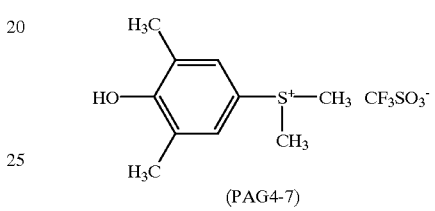
(PAG4-7)
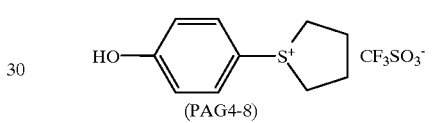
(PAG4-8)
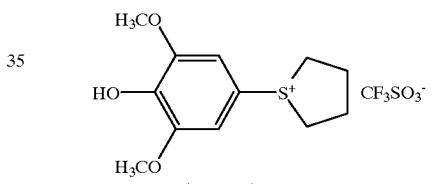
(PAG4-9)
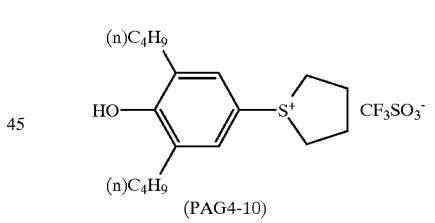
(PAG4-10)
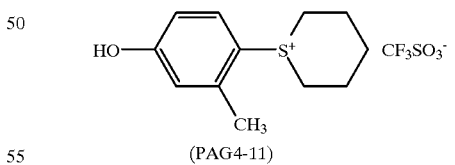
(PAG4-11)
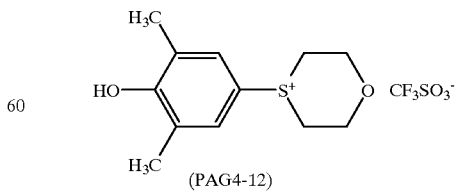
(PAG4-12)

-continued

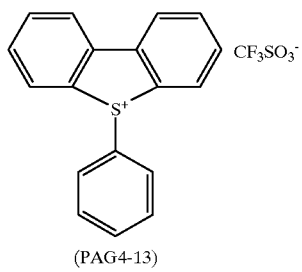
(PAG4-13)

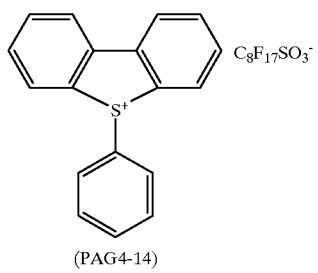
(PAG4-14)

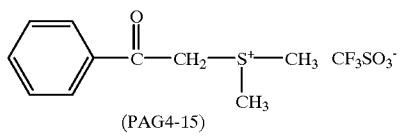
(PAG4-15)

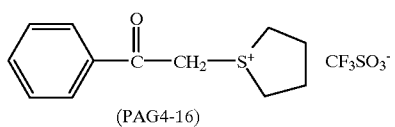
(PAG4-16)

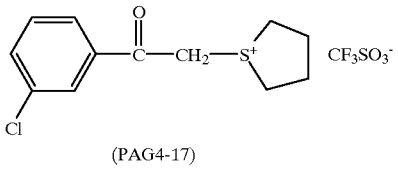
(PAG4-17)

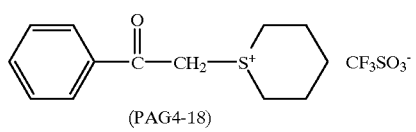
(PAG4-18)

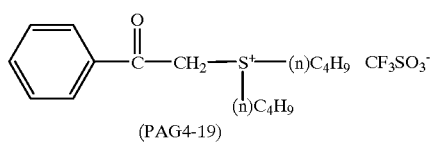
(PAG4-19)

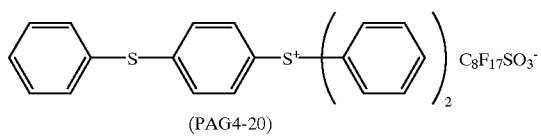
(PAG4-20)

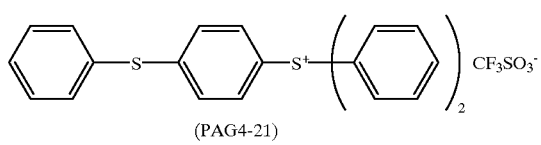
(PAG4-21)

-continued

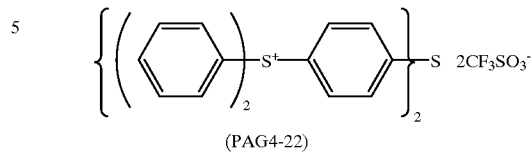
(PAG4-22)

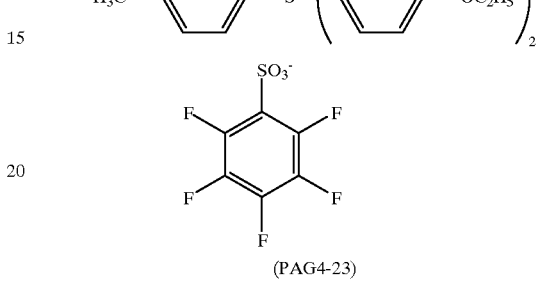
(PAG4-23)

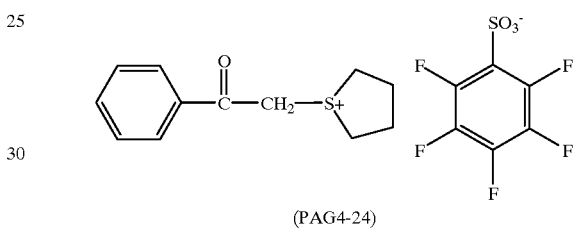
(PAG4-24)

The above-described onium salts of formulae (PAG3) and (PAG4) are known compounds, and can be prepared using the methods described, e.g., in J. W. Knapczyk et al., *J. Am. Chem. Soc.*, 91, 145 (1969), A. L. Maycoket al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone compounds represented by the following formula (PAG5), or iminosulfonate compounds represented by the following formula (PAG6):

(PAG5)

$$Ar^3-SO_2-SO_2-Ar^4$$

(PAG6)

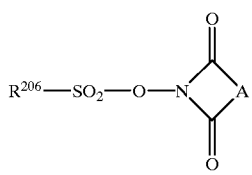

wherein $Ar^3$ and $Ar^4$ are each a substituted or unsubstituted aryl group; $R^{206}$ is a substituted or unsubstituted alkyl or aryl group; and A is a substituted or unsubstituted alkylene, alkenylene or arylene group.

Examples of such compounds are shown below, but these examples should not be construed as limiting the scope of the present invention.

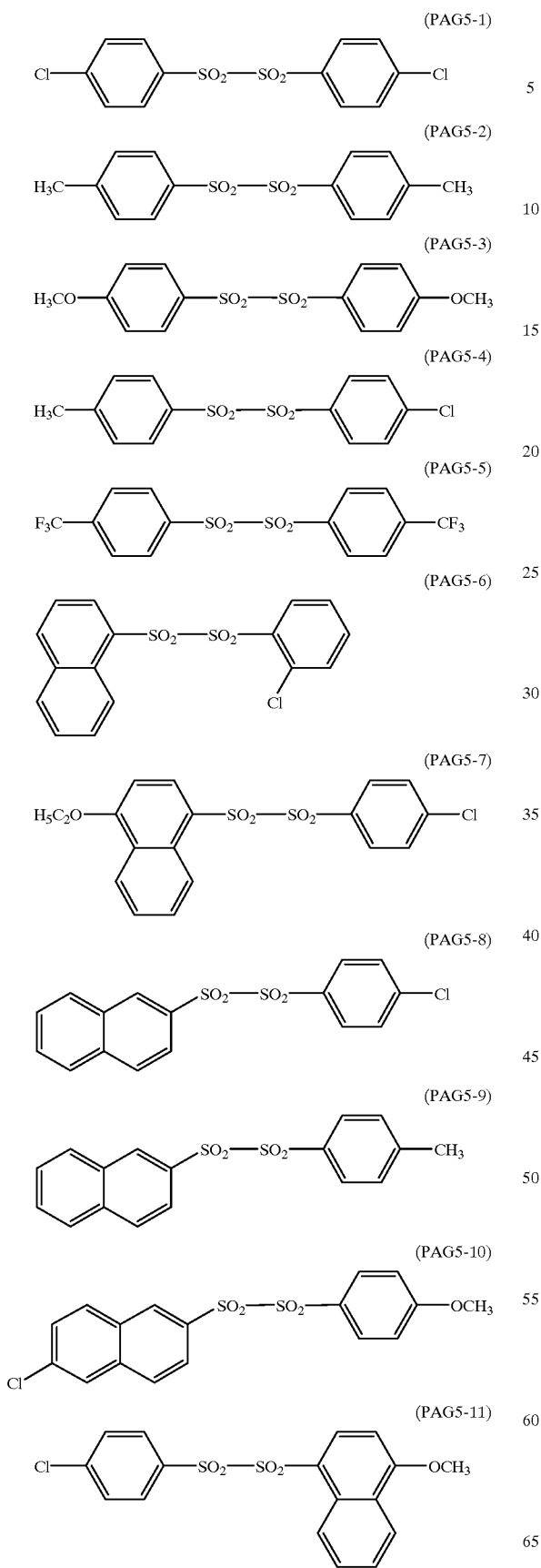
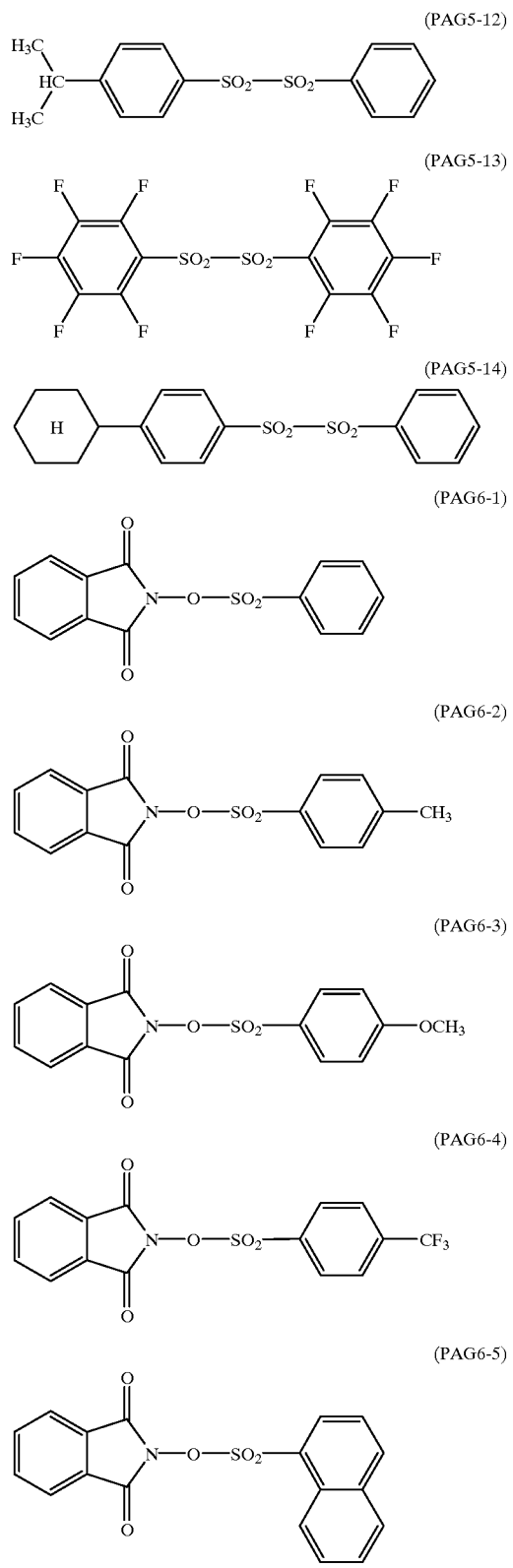

(PAG6-6)
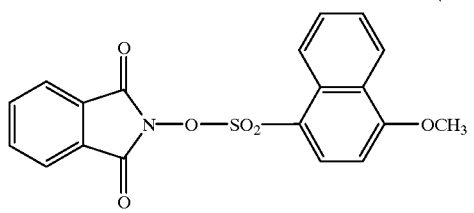

(PAG6-7)
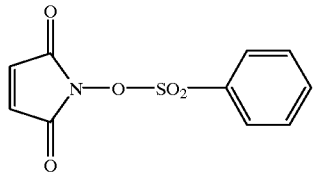

(PAG6-8)
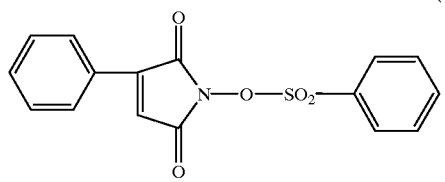

(PAG6-9)
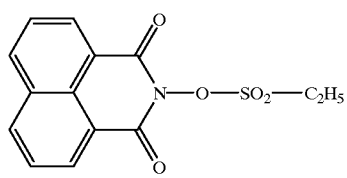

(PAG6-10)
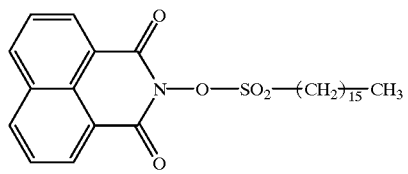

(PAG6-11)
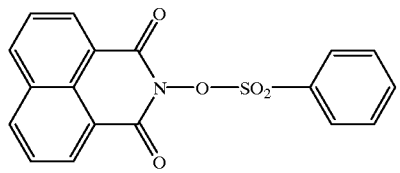

(PAG6-12)
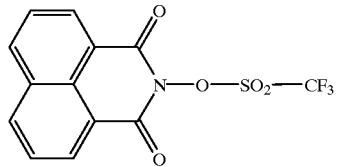

(PAG6-13)
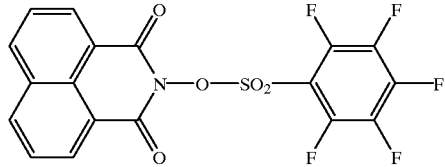

(PAG6-14)
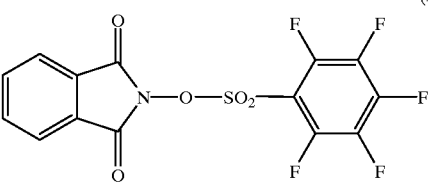

To the positive photoresist composition may be added appropriate alkali-soluble low molecular weight compounds for the purposes of increasing the solubility of the resist in alkali and controlling the glass transition temperature of the resist to prevent the composition from forming a brittle film and undergoing deterioration in heat resistance. Examples of such an alkali-soluble low molecular weight compound include the compounds containing an acid group in a molecule, such as dialkylsulfonamide compounds, dialkyl-sulfonylimide (—$SO_2$—NH—CO—) compounds and dialkyldisulfonylimide (—$SO_2$—NH—$SO_2$—) compounds. The suitable proportion of such an alkali-soluble low molecular weight compound is 40% by weight or less, preferably 30% by weight or less, and more preferably 25% by weight, based on the weight of the binder resin.

In practical use, it is desirable that the composition of the present invention be dissolved in a particular solvent. For dissolution of the composition, any organic solvents may be used so long as they can dissolve all the solid components satisfactorily and the solutions obtained can form uniform films by the conventional coating method, such as a spin coating method. Such solvents may be used alone or as a mixture of two or more thereof. Suitable examples of such a solvent include n-propyl alcohol, isopropyl alcohol, n-butyl alcohol, t-butyl alcohol, methyl cellosolve acetate, ethyl cellosolve acetate, propylene glycol monoethylether acetate, methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methyl ethyl ketone, 1,4-dioxane, ethylene glycol monomethyl ether, ethylene glycol monomethyl ether acetate, ethylene glycol monoethyl ether, ethylene glycol monoisopropyl ether, diethylene glycol monomethyl ether, diethylene glycol dimethyl ether and 2-heptanone. However, it should be understood that these examples are not to be construed as limiting the solvents usable in the present invention.

To each of the positive photoresist composition, other ingredients, such as a surfactant, a coloring matter, a stabilizer, a coatability improver and a dye, may further be added, if desired.

The positive photoresist composition is coated on a substrate to form a thin film. It is desirable that the film coated has a thickness of 0.4–1.5 μm. With respect to the exposure means, the means capable of emitting light in the wavelength range of 170–220 nm, such as an ArF excimer laser stepper, are preferably used. In particular, an ArF excimer laser stepper is preferred.

The present invention will be described in greater detail by reference to the following examples. However, the invention should not be construed as being limited to these examples.

SYNTHESIS EXAMPLES (1) Synthesis of Resin A [Repeating Units (II-113) and (I-35)]

A mixture of equimolar amounts of 8-(t-butoxycarbonyl) tetracyclododeca-3-ene and maleic anhydride was dissolved in THF to prepare a solution having the solid content concentration of 60%. This solution was placed in a three-necked flask, and heated up to 60° C. under a stream of nitrogen. After the solution temperature was stabilized, the solution was admixed with 5 mole % of a radical initiator V-65 produced by Wako Pure Chemical Industries, Ltd., and heated for 6 hours as it was. After completion of the heating, the reaction solution was precipitated with a toluene-hexane mixture, and the powdery precipitate was filtered off. The powder thus obtained was reacted with 2-cyanoethanol under a basic condition. After completion of the reaction, distilled water was added to precipitate the reaction product. The white powder precipitated was washed twice with water. Thus, the intended Resin A was obtained.

Residual t-butyl group and formation of the intended Resin A were confirmed by the NMR spectrum of the white powder obtained.

By the GPC measurement, the weight average molecular weight of the Resin A obtained was determined to be 10,600 based on the standard polystyrene.

(2) Synthesis of Resin B [Repeating Units (II-129) and (I-1)]

A mixture of equimolar amounts of 8-(2-hydroxyethyl) tetracyclododeca-3-ene and maleic anhydride was dissolved in THF to prepare a solution having the solid content concentration of 60%. This solution was placed in a three-necked flask, and heated up to 60° C. under a stream of nitrogen. After the solution temperature was stabilized, the solution was admixed with 5 mole % of a radical initiator V-65 produced by Wako Pure Chemical Industries, Ltd., and heated for 6 hours as it was. After completion of the heating, the reaction solution was precipitated with a toluene-hexane mixture, and the powdery precipitate was filtered off. The powder thus obtained was reacted with t-butanol under a basic condition. After completion of the reaction, 1% aqueous acetic acid was added to precipitate the reaction product. The white powder precipitated was washed twice with water. Thus, the intended Resin B was obtained.

Formation of the intended Resin B was confirmed by the NMR spectrum of the white powder obtained.

By the GPC measurement, the weight average molecular weight of the Resin B obtained was determined to be 10,200 based on the standard polystyrene.

(3) Synthesis of Resin C [Repeating Units (II-131) and (I-1)]

The intended Resin C was obtained in the same manner as in Synthesis Example (2), except that 8-(methylsulfonylaminocarbonyl) tetracyclododeca-3-ene was used in place of 8-(2-hydroxyethyl) tetracyclododeca-3-ene.

Formation of the intended Resin C was confirmed by the NMR spectrum of the product obtained.

By the GPC measurement, the weight average molecular weight of the Resin C obtained was determined to be 9,700 based on the standard polystyrene.

(4) Synthesis of Resin D [Repeating Units (II-140) and (I-19)]

A mixture of equimolar amounts of pantoyl lactone ester of 8-carboxytetracyclododeca-3-ene and maleic anhydride was dissolved in THF to prepare a solution having the solid content concentration of 60%. This solution was placed in a three-necked flask, and heated up to 60° C. under a stream of nitrogen. After the solutiontemperature was stabilized, the solution was admixed with 5 mole % of a radical initiator V-65 produced by Wako Pure Chemical Industries, Ltd., and heated for 6 hours as it was. After completion of the heating, the reaction solution was precipitated with distilled water, and the powdery precipitate was filtered off. The powder thus obtained was reacted with t-butanol under a basic condition. After completion of the reaction, 1% aqueous acetic acid was added to precipitate the reaction product. The white powder precipitated was washed twice with water. The powder obtained was reacted with thionyl chloride, and then with β-alanine. Thus, the intended Resin D was obtained.

Formation of the intended Resin D was confirmed by the NMR spectrum of the product obtained.

By the GPC measurement, the weight average molecular weight of the Resin D obtained was determined to be 10,900 based on the standard polystyrene.

(5) Synthesis of Resin E [Repeating Units (II-156), (I-1) and (I-25)]

A mixture of equimolar amounts of 8-cyanotetracyclododeca-3-ene and maleic anhydride was dissolved in THF to prepare a solution having the solid content concentration of 60%. This solution was placed in a three-necked flask, and heated up to 60° C. under a stream of nitrogen. After the solution temperature was stabilized, the solution was admixed with 5 mole % of a radical initiator V-65 produced by Wako Pure Chemical Industries, Ltd., and heated for 6 hours as it was. After completion of the heating, the reaction solution was precipitated with a toluene-hexane mixture, and the powdery precipitate was filtered off. The powder thus obtained was reacted with t-butanol under a basic condition. After completion of the reaction, 1% aqueous acetic acid was added to precipitate the reaction product. The white powder precipitated was washed twice with water. Then, the precipitate obtained was reacted with thionyl chloride. After removal of excess thionyl chloride, the reaction product was further reacted with pantoyl lactone under a basic condition. Thus, the intended Resin E was obtained.

Formation of the intended Resin E was confirmed by the NMR spectrum of the product obtained.

By the GPC measurement, the weight average molecular weight of the Resin E obtained was determined to be 11,100 based on the standard polystyrene.

(6) Synthesis of Resin F [Repeating Units (II-147), (I-1) and (I-20)]

A mixture of equimolar amounts of dicyclopentadiene and maleic anhydride was dissolved in THF to prepare a solution having the solid content concentration of 60%. This solution was placed in a three-necked flask, and heated up to 60° C. under a stream of nitrogen. After the solution temperature was stabilized, the solution was admixed with 5 mole % of a radical initiator V-65 produced by Wako Pure Chemical Industries, Ltd., and heated for 6 hours as it was. After completion of the heating, the reaction solution was precipitated with hexane, and the powdery precipitate was filtered off. The powder thus obtained was reacted with t-butanol under a basic condition. After completion of the reaction, 1% aqueous acetic acid was added to precipitate the reaction product. The white powder precipitated was washed twice with water. This white powder was subjected to a conventional reduction reaction using a Pd catalyst, thereby the C-C double bond therein was reduced. The resulting powder was then reactedwith thionyl chloride. After removal of excess thionyl chloride, the reaction product was further reacted with ethanolamine. Thus, the intended Resin F was obtained. Formation of the intended Resin F was confirmed by the NMR spectrum of the product obtained. By the GPC measurement, the weight average molecular weight of the Resin F obtained was determined to be 12,300 based on the standard polystyrene.

(7) Synthesis of Resin G [Repeating Units (II-113) and (I-38)]

A mixture of equimolar amounts of 8-(t-butoxycarbonyl) tetracyclododeca-3-ene and maleic anhydride was dissolved in THF to prepare a solution having the solid content concentration of 60%. This solution was placed in a three-necked flask, and heated up to 60° C. under a stream of nitrogen. After the solution temperature was stabilized, the solution was admixed with 5 mole % of a radical initiator V-65 produced by Wako Pure Chemical Industries, Ltd., and heated for 6 hours as it was. After completion of the heating, the reaction solution was precipitated with a toluene-hexane mixture, and the powdery precipitate was filtered off. The powder thus obtained was reacted with pantoyl lactone under a basic condition. After completion of the reaction, distilled water was added to precipitate the reaction product. The white powder precipitated was washed twice with water. Thus, the intended Resin G was obtained.

Residual t-butyl group and formation of the intended Resin G were confirmed by the NMR spectrum of the white powder obtained.

By the GPC measurement, the weight average molecular weight of the Resin G obtained was determined to be 11,100 based on the standard polystyrene.

(8) Synthesis of Resin H [Repeating Units (II-113) and (I-46)]

A mixture of equimolar amounts of 8-(t-butoxycarbonyl) tetracyclododeca-3-ene and maleic anhydride was dissolved in THF to prepare a solution having the solid content concentration of 60%. This solution was placed in a three-necked flask, and heated up to 60° C. under a stream of nitrogen. After the solution temperature was stabilized, the solution was admixed with 5 mole % of a radical initiator V-65 produced by Wako Pure Chemical Industries, Ltd., and heated for 6 hours as it was. After completion of the heating, the reaction solution was precipitated with a toluene-hexane mixture, and the powdery precipitate was filtered off. The powder thus obtained was reacted with tricyclodecane dimethanol under a basic condition. After completion of the reaction, distilled water was added to precipitate the reaction product. The white powder precipitated was washed twice with water. Thus, the intended Resin H was obtained.

Residual t-butyl group and formation of the intended Resin H were confirmed by the NMR spectrum of the white powder obtained.

By the GPC measurement, the weight average molecular weight of the Resin H obtained was determined to be 12,500 based on the standard polystyrene.

(9) Synthesis of Comparative Resin X

A copolymer of norbornene, maleic anhydride, t-butyl acrylate and acrylic acid was produced according to Example 7 in paragraph [0066] of JP-A-10-10739.

Example 1 and Comparative Example 1

Each of the resins synthesized in the above Synthesis Examples in an amount of 10 g and 0.25 g of 4-hydroxynaphthyldimethylsulfonium triflate as an acid generator were dissolved in 2-heptanone (mixed with 2-hydroxypropionic acid, if needed) such that the resulting solution had the total solid content concentration of 14% by weight, and the solution was filtered through a 0.1 µm microfilter. Thus, solution samples of positive photoresist composition were prepared.

Evaluation Test
[Number of Cracks]

Each of the resist composition solutions was coated in the thickness of 0.5 µm on a 4-inch bare Si substrate by means of a spin coater, and dried at 130° C. for 90 seconds. Each coating thus formed was subjected to 50 shots of exposure via a large rectangular pattern having the size of 1 mm×3 mm as the exposure amount was changed by 2 mJ/cm$^2$ from 2 mJ/cm$^2$ to 100 mJ/cm$^2$ with a stepper NSR-1505EX [ArF excimer laser (193 nm)], and then heated at 130° C. for 90 seconds. Thereafter, it was developed with a 2.38% aqueous solution of tetramethylammonium hydroxide (TMAH). The pattern corresponding to the 5 shots of exposure counted from the pattern exposed to light in the exposure amount that enabled first the thorough dissolution of the exposed area of the coating were observed under an optical microscope, and the cracks in those patterns were counted.

The evaluation results are shown in Table 1.

TABLE 1

| | Sample No. | Kind of Resin | Number of Cracks |
|---|---|---|---|
| Example 1 | 1 | A | None |
| | 2 | B | None |
| | 3 | C | None |
| | 4 | D | None |
| | 5 | E | None |
| | 6 | F | None |
| | 7 | G | None |
| | 8 | H | None |
| Comparative Example 1 | | X | 20 |

As shown in Table 1, generation of cracks was well-inhibited in the patterns formed using the resist composition of the present invention, but use of the comparative resist composition caused generation of cracks.

Example 2

Positive photoresist composition solutions were prepared using the Resins A to H synthesized in the above Synthesis Examples, respectively, in the same manner as in Example 1.

Each of the solution samples thus prepared was coated on a silicon wafer with a spin coater, and dried at 120° C. for 90 seconds to form a positive photoresist film having a thickness of about 0.5 µm. Each of the photoresist films formed was subjected to exposure with an ArF excimer laser (193 nm), heated at 130° C. for 90 seconds, developed with a 2.38% aqueous solution of tetramethylammonium hydroxide, and then rinsed with distilled water to obtain resist pattern profiles.

Evaluation Test
[Adhesiveness to Substrate] (Width of Finest Line Remaining on Substrate)

By the observation of the thus formed resist pattern profiles under a scanning electron microscope, the finest line pattern among line patterns remaining on the silicon wafer was found out. The adhesiveness of each resist sample to a substrate was evaluated by the width of the residual finest line. This is because a resist film having higher adhesiveness can retain the finer line pattern on the substrate. In other words, if a resist film has inferior adhesiveness, it is harder for the finer line pattern to adhere firmly to the substrate surface, so that the finer line pattern is more liable to come off.

The results obtained are shown in Table 2.

TABLE 2

| Sample No. | Kind of Resin | Width of Residual Finest Line (μm) |
|---|---|---|
| 1 | A | 0.20 |
| 2 | B | 0.22 |
| 3 | C | 0.22 |
| 4 | D | 0.22 |
| 5 | E | 0.20 |
| 6 | F | 0.20 |
| 7 | G | 0.20 |
| 8 | H | 0.20 |

As can be seen from Table 2, the resist compositions of the present invention enable very fine line pattern to remain on the substrate. In other words, their adhesiveness proves to be excellent.

Example 3

Positive photoresist composition solutions were prepared using the Resins A to H synthesized in the Synthesis Examples, espectively, in the same manner as in Example 2, and resist pattern profiles were formed therefrom, respectively. The resist pattern profiles obtained were observed under a scanning electron microscope. All the profiles obtained using the compositions of the present invention (Sample Nos. 1–8) were rectangular and had good shape.

Photoresist compositions according to the present invention can be suitably used for photolithography using far ultraviolet light sources, such as excimer laser beam sources, especially an ArF excimer laser beam source, and not only have excellent dry etching resistance and high sensitivity but also form resist patterns which are fully inhibited from generating cracks and have sufficiently high adhesiveness to a substrate and excellent profile.

While the invention has been described in detail and with reference to specific embodiments thereof, it will be apparent to one skilled in the art that various changes and modifications can be made therein without departing from the spirit and scope thereof.

What is claimed is:

1. A positive photoresist composition for exposure to far ultraviolet light which comprises a resin decomposing by the action of an acid to increase its solubility in an alkali, and a compound generating an acid by irradiation with an actinic ray or radiation, said resin comprising a polymer that contains as repeating units both units represented by the following formula (I) and units represented by the following formula (II-A) or (II-B) and further has groups decomposing by the action of an acid:

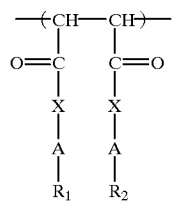
(I)

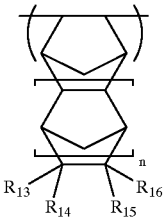
(II-A)

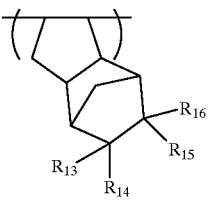
(II-B)

wherein $R_1$ and $R_2$ each independently represent a hydrogen atom, a cyano group, a hydroxyl group, —OOOH, —COOR$_5$, —CO—NH—R$_6$, —CO—NH—SO$_2$—R$_6$, a substituted or unsubstituted alkyl, alkoxy or cyclic hydrocarbon group, or a group —Y; $R_5$ represents a substituted or unsubstituted alkyl or cyclic hydrocarbon group, or a group —Y; the group —Y is represented by

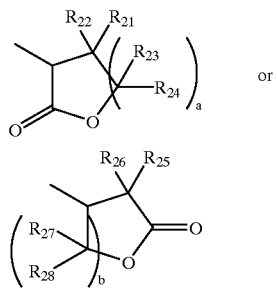

wherein $R_{21}$ to $R_{28}$ each independently represent a hydrogen atom or a substituted or unsubstituted alkyl group, and a and b are each 1 or 2; $R_6$ represents a substituted or unsubstituted alkyl or cyclic hydrocarbon group; X represents an oxygen atom, a sulfur atom, —NH—, —NHSO$_2$—, or —NHSO$_2$NH—; $R_{13}$ to $R_{16}$ each independently represent a hydrogen atom, a halogen atom a cyano group, —COOH, an acid-decomposable group, —C(=O)—X—A—R$_{17}$ or an unsubstituted or substituted alkyl or cyclic hydrocarbon group, or at least two of the substituents $R_{13}$ to $R_{16}$ combine with each other to form a ring; n is 0 or 1; $R_{17}$ represents —COOH, —COOR$_5$, —CN, a hydroxyl group, an unsubstituted or substituted alkoxy group, —CO—NH—R$_6$, —CO—NH—SO$_2$—R$_6$ or the group —Y; and A represents a single bond or a divalent linkage group.

* * * * *